(12) United States Patent
Sato

(10) Patent No.: US 11,394,320 B2
(45) Date of Patent: Jul. 19, 2022

(54) CONTROL METHOD FOR PIEZOELECTRIC DRIVE DEVICE, PIEZOELECTRIC DRIVE DEVICE, ROBOT, AND PRINTER

(71) Applicant: Seiko Epson Corporation, Tokyo (JP)

(72) Inventor: Ryuichi Sato, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 479 days.

(21) Appl. No.: 16/666,854

(22) Filed: Oct. 29, 2019

(65) Prior Publication Data

US 2020/0136531 A1    Apr. 30, 2020

(30) Foreign Application Priority Data

Oct. 30, 2018 (JP) .............................. JP2018-204227

(51) Int. Cl.
| | |
|---|---|
| *H02N 2/14* | (2006.01) |
| *B41J 2/045* | (2006.01) |
| *H01L 41/04* | (2006.01) |
| *H01L 41/09* | (2006.01) |
| *H02N 2/10* | (2006.01) |

(52) U.S. Cl.
CPC ............ *H02N 2/14* (2013.01); *B41J 2/04581* (2013.01); *H01L 41/042* (2013.01); *H01L 41/09* (2013.01); *H02N 2/103* (2013.01)

(58) Field of Classification Search
CPC .......... H02N 2/14; H02N 2/103; H02N 2/004; H02N 2/0075; H02N 2/142; H02N 2/10; H01L 41/042; H01L 41/09; B41J 2/04581
See application file for complete search history.

(56) References Cited

U.S. PATENT DOCUMENTS

| | | | |
|---|---|---|---|
| 5,453,653 A | 9/1995 | Zumeris | |
| 2013/0140952 A1* | 6/2013 | Kamijo | H02N 2/103 310/328 |

FOREIGN PATENT DOCUMENTS

| | | |
|---|---|---|
| JP | H08-237971 A | 9/1996 |
| JP | H11-089255 A | 3/1999 |
| JP | 2013-146152 A | 7/2013 |
| JP | 2014-117071 A | 6/2014 |

* cited by examiner

*Primary Examiner* — Emily P Pham
(74) *Attorney, Agent, or Firm* — Gang Yu

(57) ABSTRACT

A control method for a piezoelectric drive device includes a piezoelectric vibrator having a vibrating portion and a distal end portion coupled to the vibrating portion, in which the distal end portion makes elliptic motion by a stretching vibration and a flexural vibration of the vibrating portion, a driven member driven by the elliptic motion of the distal end portion, and a drive signal generation circuit outputting a stretching vibration drive signal that generates the stretching vibration and a flexural vibration drive signal that generates the flexural vibration in the piezoelectric vibrator, and the method includes, when the driven member is stopped, superimposing and outputting a modulation signal for amplitude modification on the stretching vibration drive signal by the drive signal generation circuit.

10 Claims, 18 Drawing Sheets

CONTROL METHOD FOR PIEZOELECTRIC DRIVE DEVICE, PIEZOELECTRIC DRIVE DEVICE, ROBOT, AND PRINTER

The present application is based on, and claims priority from, JP Application Serial Number 2018-204227, filed Oct. 30, 2018, the disclosure of which is hereby incorporated by reference herein in its entirety.

BACKGROUND

1. Technical Field

The present disclosure relates to a control method for piezoelectric drive device, piezoelectric drive device, robot, and printer.

2. Related Art

JP-A-8-237971 discloses a piezoelectric micromotor including first and second piezoelectric plates having electrodes coupled to front surfaces and back surfaces, a ceramic spacer that engages with a surface of an object, a source of an elastic force applied to parts of the individual plates and pressing the ceramic spacer against the surface of the object, and a voltage source applying excitation voltages to some electrodes. In the piezoelectric micromotor, the excitation voltages (AC voltages) are applied to the electrodes of the piezoelectric plates to make elliptic motion of the ceramic spacer, and thereby, drive power may be generated between the spacer and the object surface.

To smoothly activate a drive unit, a stretching vibration also in the waiting time is effective. However, the vibration is performed when the unit does not drive, and there is a problem of difficulty in reduction of power consumption.

SUMMARY

A control method for a piezoelectric drive device according to an application example of the present disclosure is a control method for a piezoelectric drive device including a piezoelectric vibrator having a vibrating portion and a distal end portion coupled to the vibrating portion, in which the distal end portion makes elliptic motion by a stretching vibration and a flexural vibration of the vibrating portion, a driven member driven by the elliptic motion of the distal end portion, and a drive signal generation circuit outputting a stretching vibration drive signal that generates the stretching vibration and a flexural vibration drive signal that generates the flexural vibration in the piezoelectric vibrator, and the method includes, when the driven member is stopped, superimposing and outputting a modulation signal for amplitude modification on the stretching vibration drive signal by the drive signal generation circuit.

DESCRIPTION OF EXEMPLARY EMBODIMENTS

As below, preferred embodiments of a control method for piezoelectric drive device, piezoelectric drive device, robot, and printer according to the present disclosure will be explained in detail according to the accompanying drawings.

First Embodiment

Figure 1:
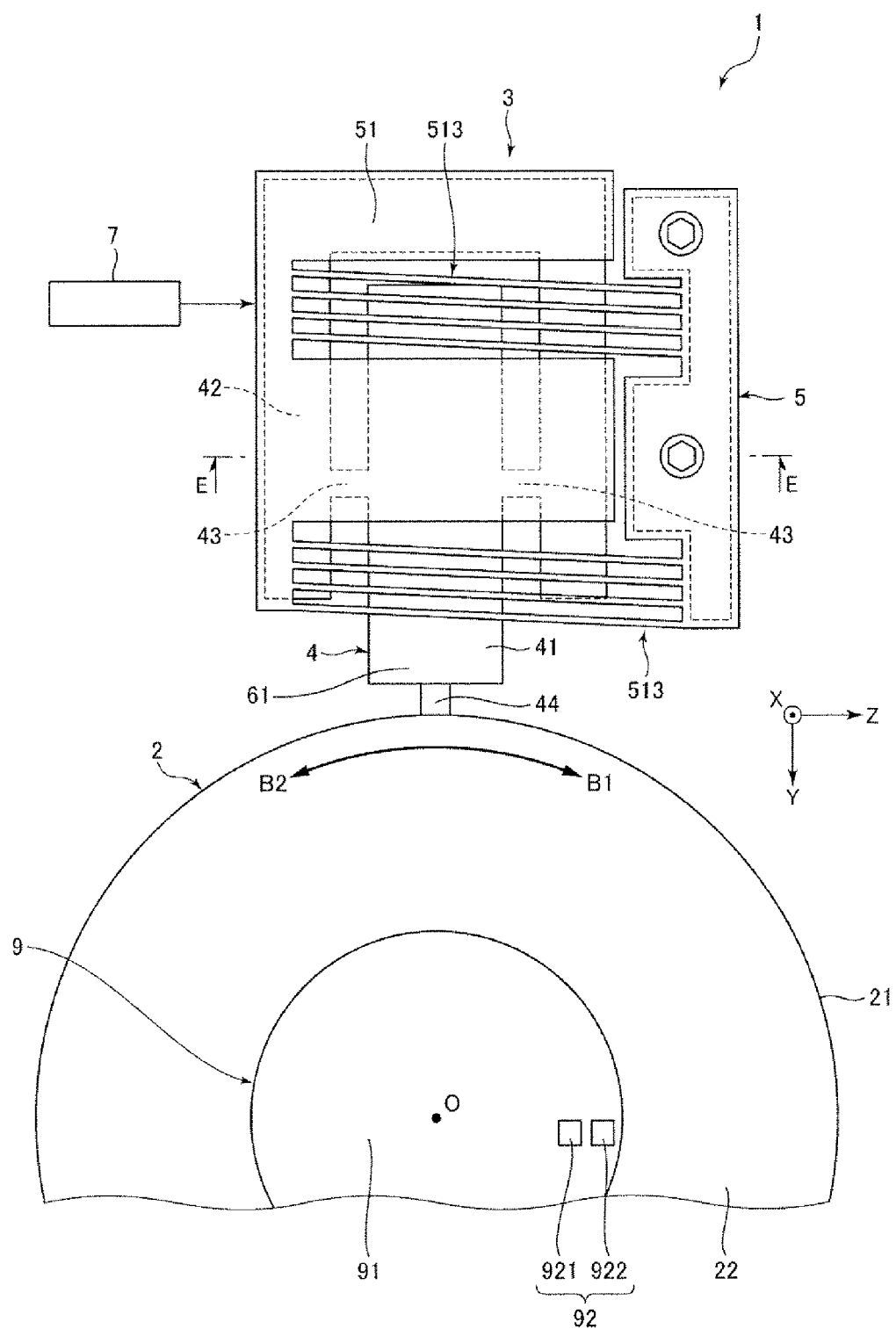
FIG. 1 is a plan view showing a piezoelectric drive device according to a first embodiment.
Figure 2:
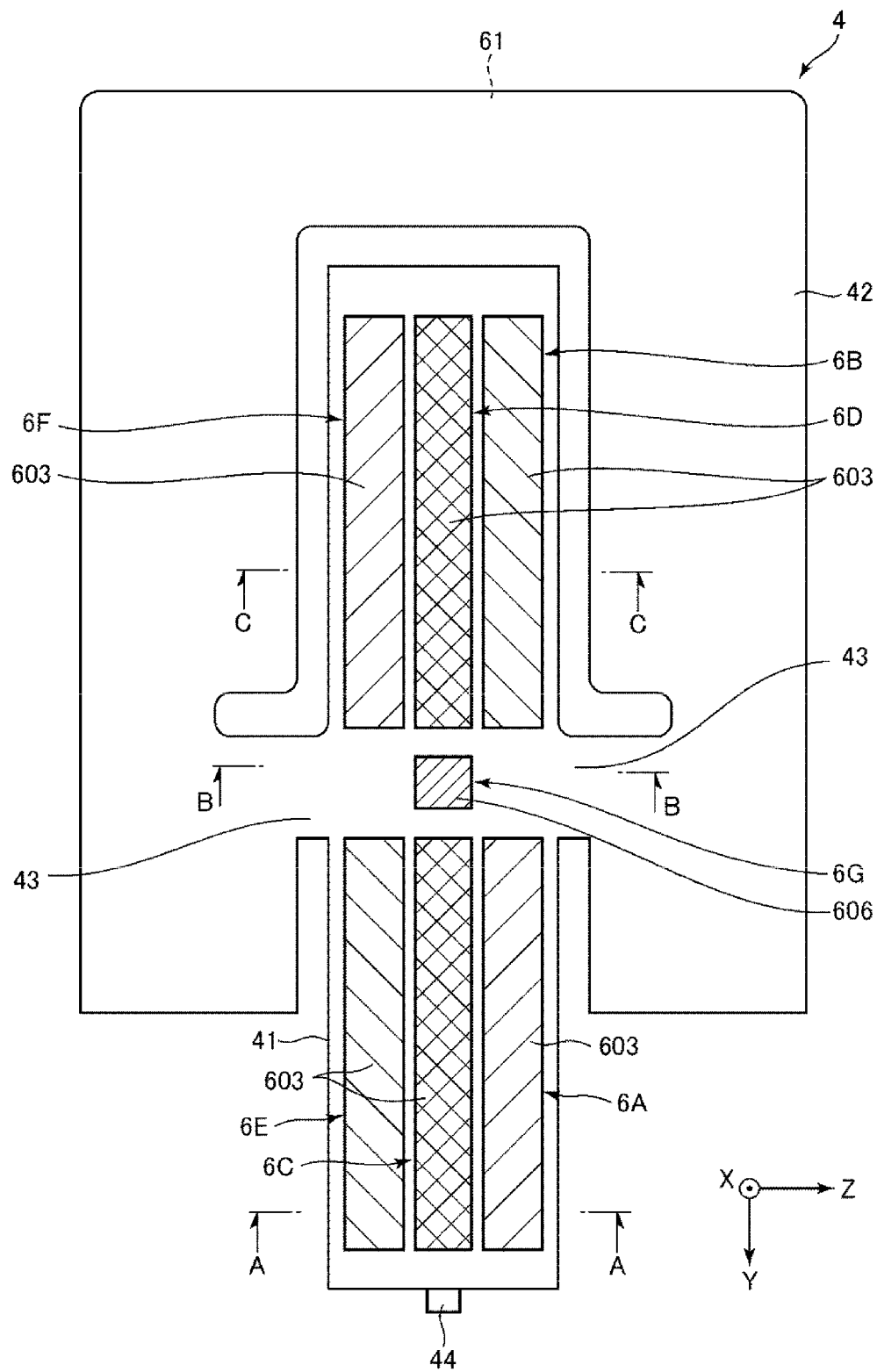
FIG. 2 is a plan view showing an arrangement of electrodes of a vibrator shown in FIG. 1.
Figure 3:
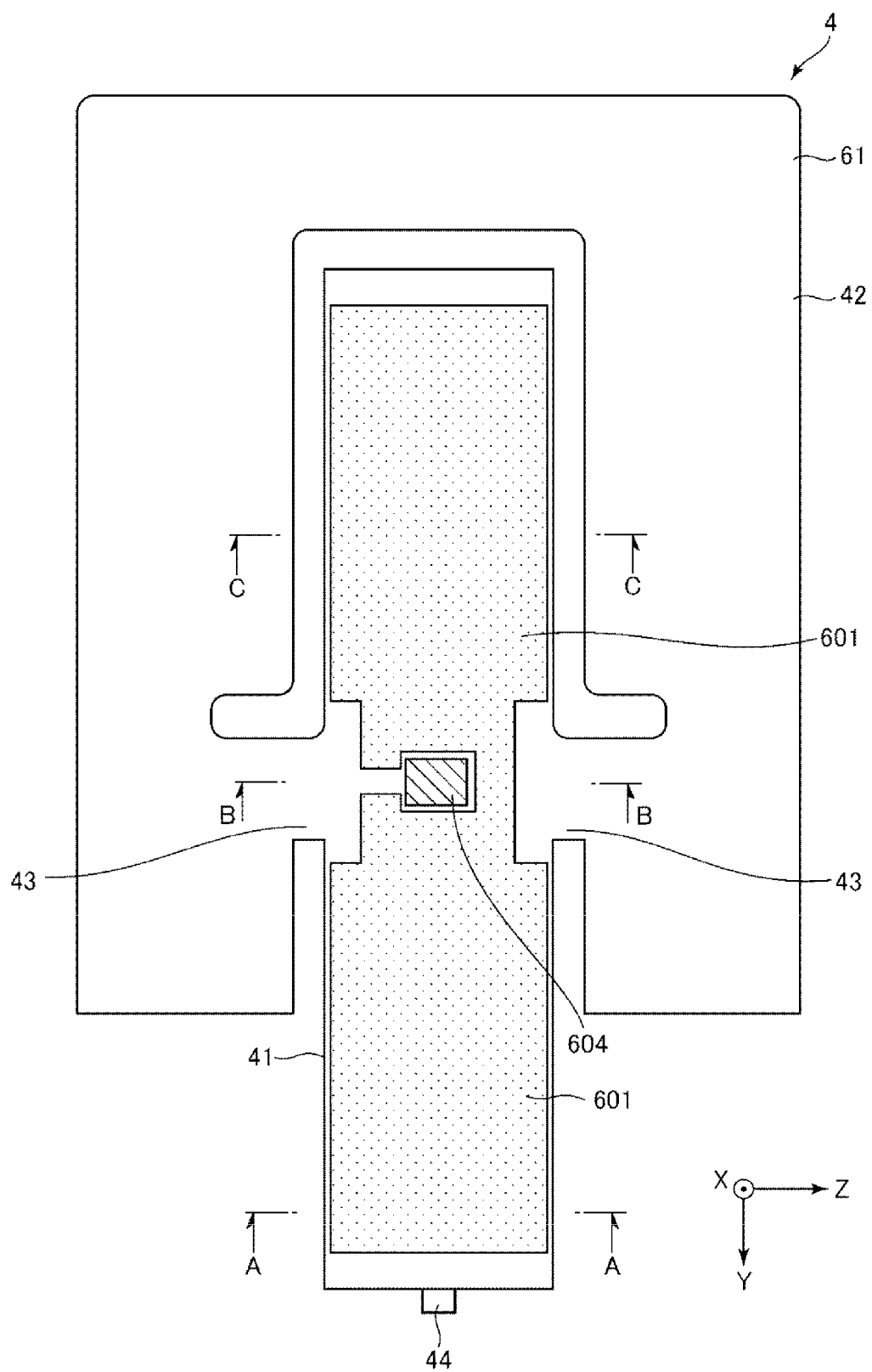
FIG. 3 is a plan view showing an arrangement of electrodes of the vibrator shown in FIG. 1.
Figure 4:
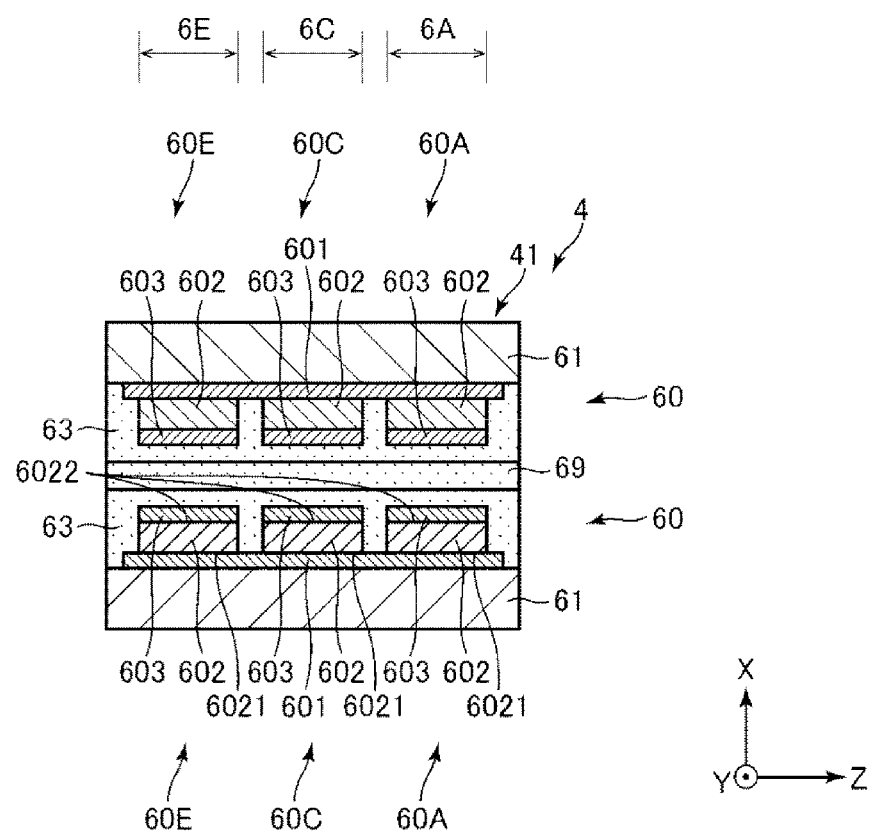
FIG. 4 is a sectional view along line A-A in FIGS. 2 and 3.
Figure 5:
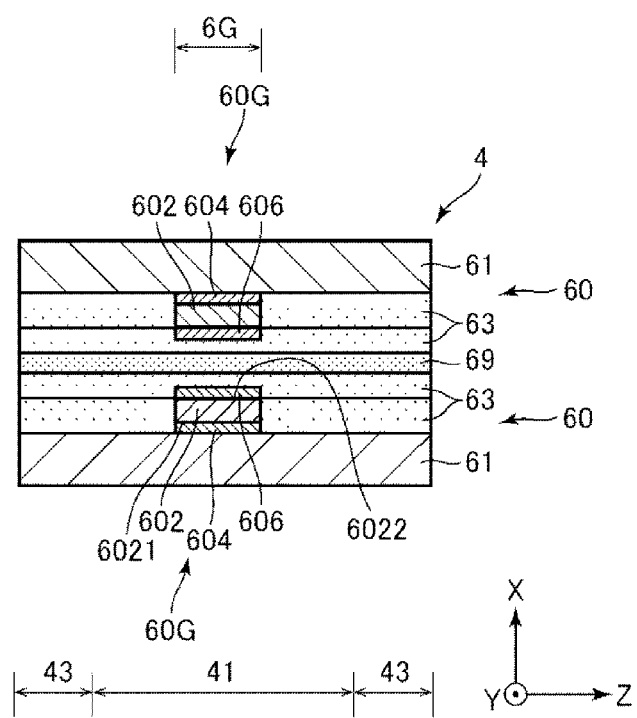
FIG. 5 is a sectional view along line B-B in FIGS. 2 and 3.
Figure 6:
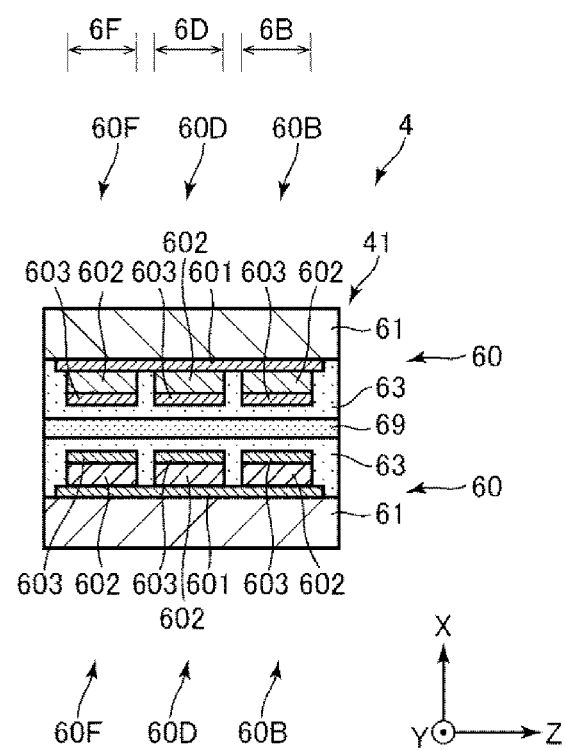
FIG. 6 is a sectional view along line C-C in FIGS. 2 and 3.
Figure 7:
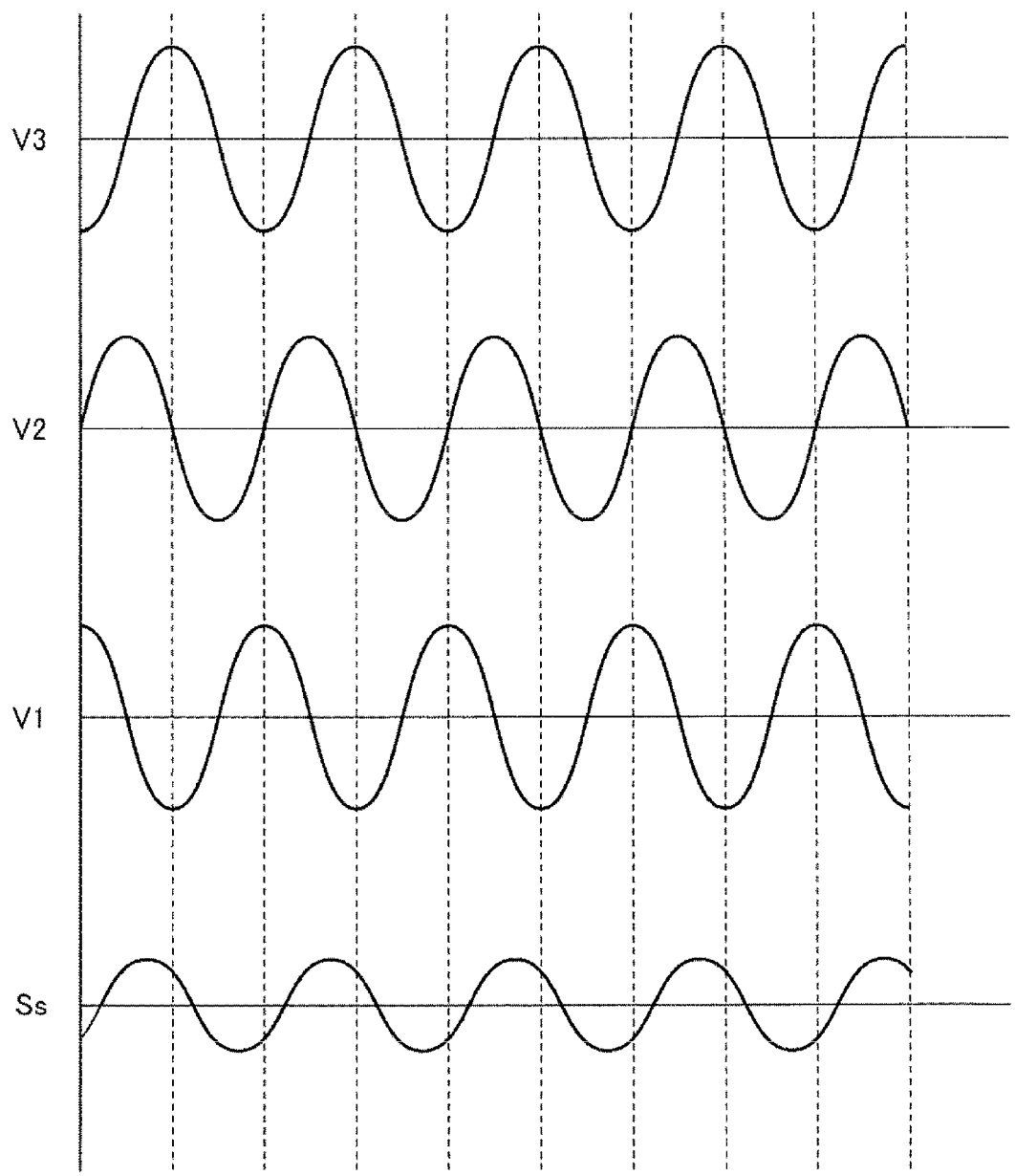
FIG. 7 shows examples of alternating-current voltages applied to a vibrating portion shown in FIG. 2.
Figure 8:
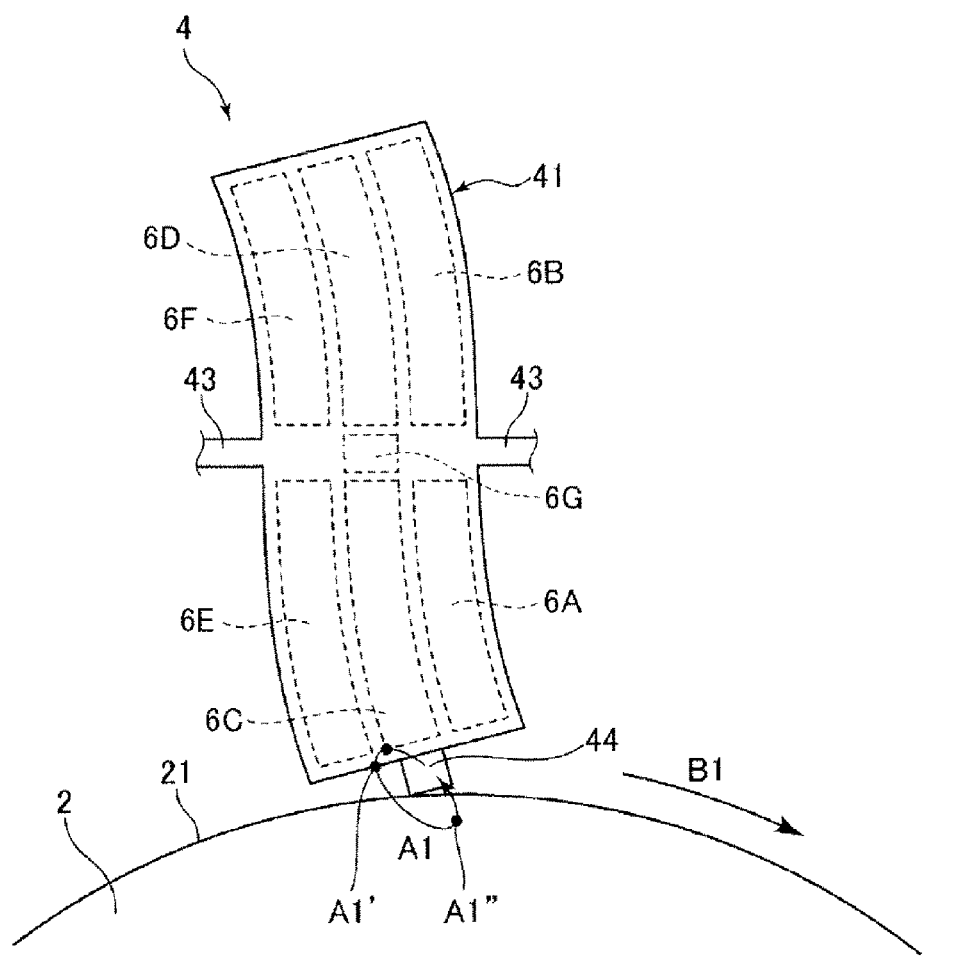
FIG. 8 is a plan view showing a drive state of the vibrating portion shown in FIG. 1.
Figure 9:
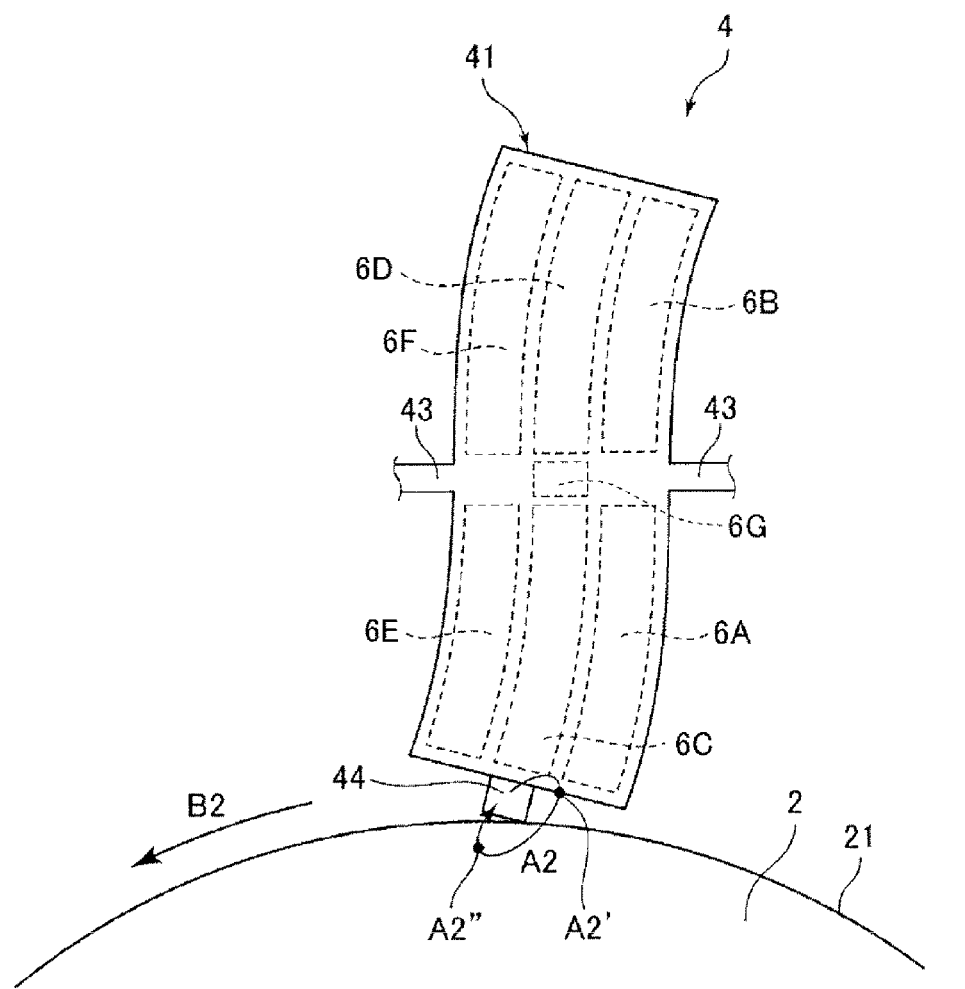
FIG. 9 is a plan view showing a drive state of the vibrating portion shown in FIG. 1.
Figure 10:
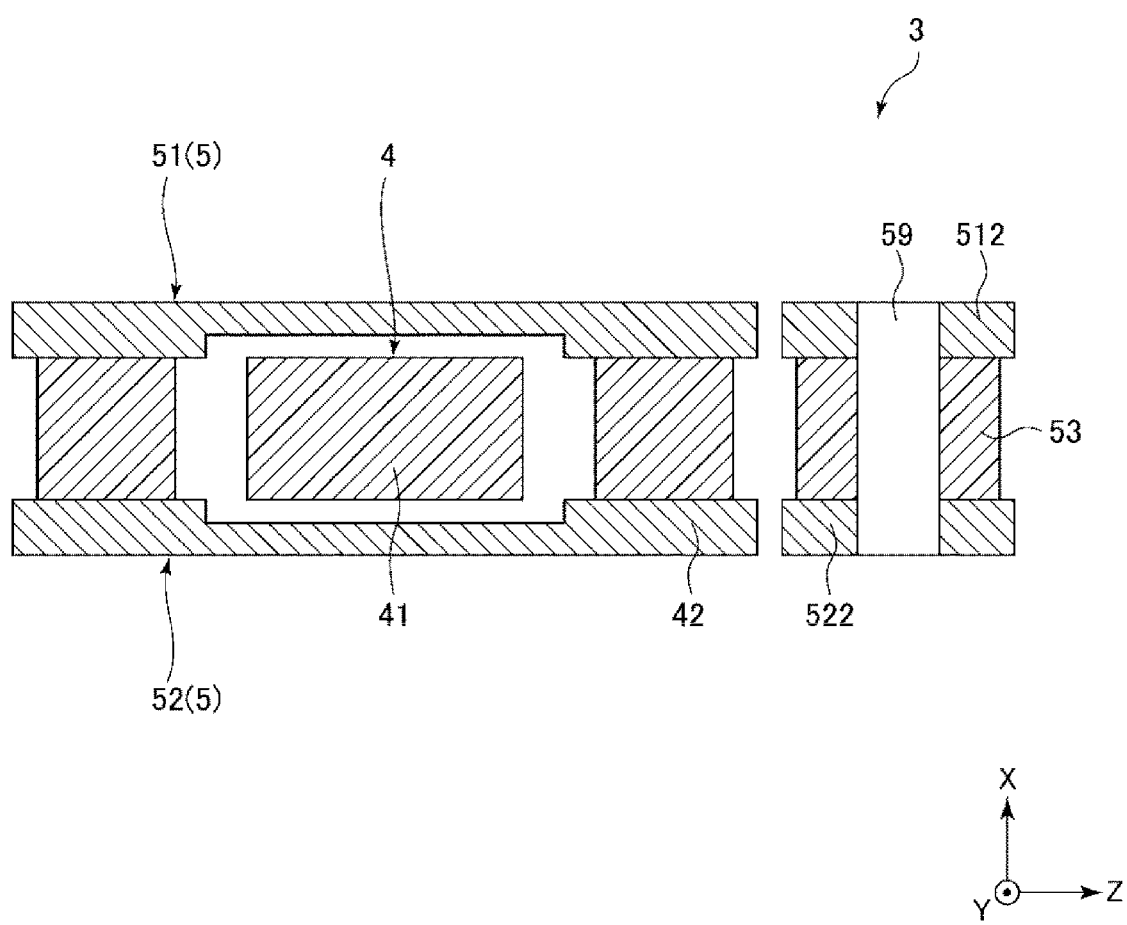
FIG. 10 is a sectional view along line E-E in FIG. 1.
Figure 11:
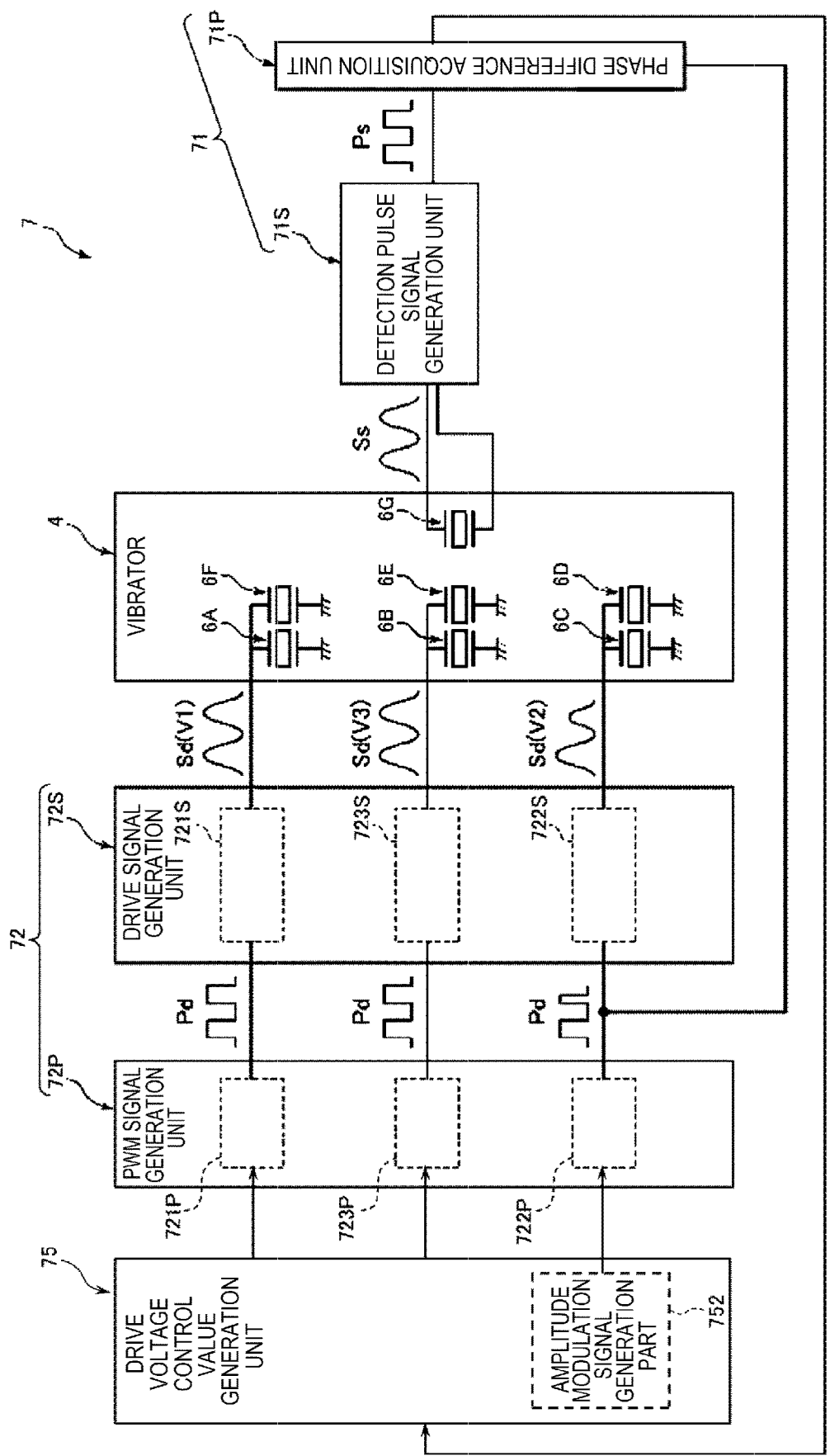
FIG. 11 is a block diagram showing a controller in FIG. 1.
Figure 12:
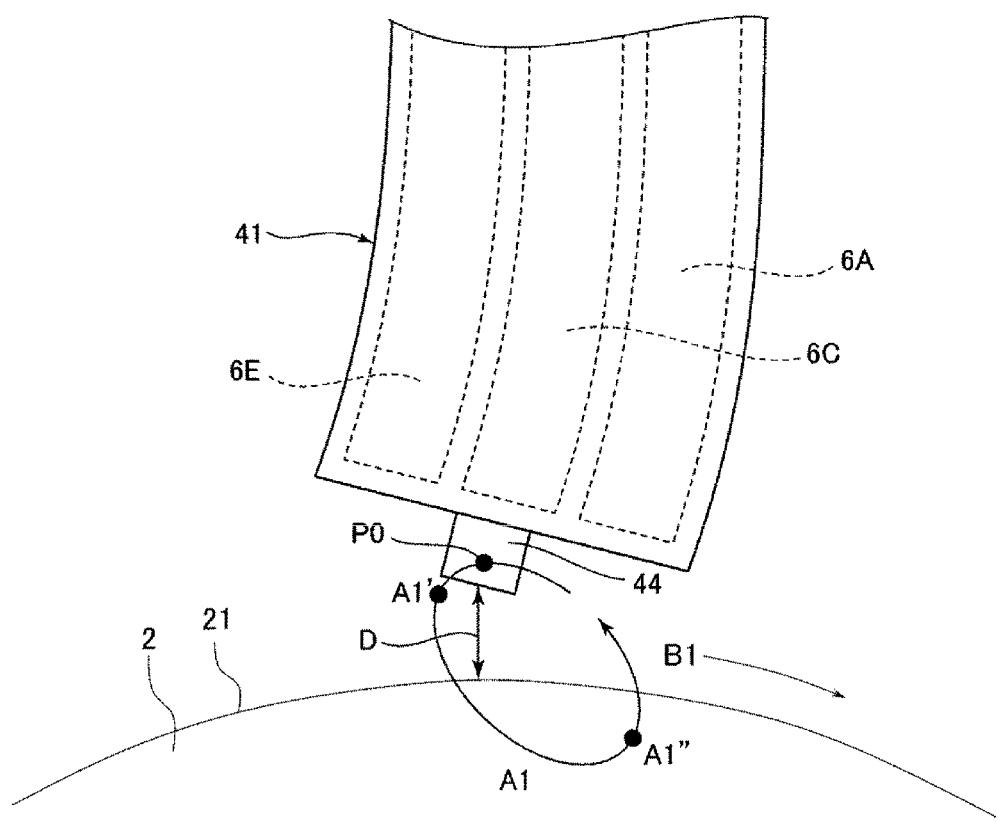
FIG. 12 is a plan view showing a separation state of a rotor and a distal end portion.

FIG. 1 is the plan view showing the piezoelectric drive device according to the first embodiment. FIGS. 2 and 3 are the plan views showing arrangements of electrodes of the vibrator shown in FIG. 1. FIG. 4 is the sectional view along line A-A in FIGS. 2 and 3. FIG. 5 is the sectional view along line B-B in FIGS. 2 and 3. FIG. 6 is the sectional view along line C-C in FIGS. 2 and 3. FIG. 7 shows the examples of the alternating-current voltages applied to a vibrating portion shown in FIG. 2. FIGS. 8 and 9 are respectively the plan views showing the drive states of the vibrating portion shown in FIG. 1. FIG. 10 is the sectional view along line E-E in FIG. 1. FIG. 11 is the block diagram showing the controller in FIG. 1. FIG. 12 is the plan view showing the separation state of the rotor and the distal end portion.

Note that, hereinafter, for convenience of explanation, three axes orthogonal to one another are referred to as "X-axis", "Y-axis", and "Z-axis", and directions along the X-axis are also referred to as "X-axis directions", directions along the Y-axis are also referred to as "Y-axis directions", and directions along the Z-axis are also referred to as "Z-axis directions". Further, the pointer sides of the respective axes are also referred to as "plus sides" and the opposite sides to the pointers are also referred to as "minus sides". Furthermore, the plus side in the X-axis direction is also referred to as "upper" or "upside" and the minus side in the X-axis direction is also referred to as "lower" or "downside".

The piezoelectric drive device 1 shown in FIG. 1 has a rotor 2 as a driven member having a circular disk shape and being rotatable about a center axis O and a vibration actuator 3 in contact with an outer circumferential surface 21 of the rotor 2. In the piezoelectric drive device 1, when the vibration actuator 3 is flexurally vibrated, the rotor 2 rotates about the center axis O parallel to the X-axis. Note that the configuration of the piezoelectric drive device 1 is not limited to the configuration in FIG. 1. For example, a plurality of the vibration actuators 3 may be placed along the circumferential direction of the rotor 2 and the rotor 2 may be rotated by driving of the plurality of vibration actuators 3. Further, the vibration actuator 3 may be in contact with a principal surface 22 of the rotor 2, not the outer circumferential surface 21 of the rotor 2. The driven member is not limited to a rotor such as the rotor 2, but may be e.g. a slider that linearly moves.

In the embodiment, an encoder 9 is provided in the rotor 2 and the encoder 9 may detect the behavior of the rotor 2, particularly, an amount of rotation and an angular velocity. The encoder 9 is not particularly limited, but may be e.g. an incremental encoder that detects the amount of rotation when the rotor 2 rotates or an absolute encoder that detects an absolute position of the rotor 2 from the origin regardless of whether the rotor 2 rotates or not.

The encoder 9 according to the embodiment has a scale 91 fixed to the upper surface of the rotor 2 and an optical element 92 provided at the upside of the scale 91. The scale 91 has a circular plate shape and has a pattern (not shown) provided on the upper surface thereof. On the other hand, the optical element 92 has a light emitting device 921 that radiates light toward the pattern of the scale 91 and an imaging device 922 that captures the pattern of the scale 91. In the encoder 9 having the above described configuration, the amount of rotation, drive speed, absolute position, etc. of the rotor 2 may be detected by template matching of the pattern image acquired by the imaging device 922. Note that the configuration of the encoder 9 is not limited to the above described configuration. For example, in place of the imaging device 922, a configuration including a light receiving device that receives reflected light or transmitted light from the scale 91 may be employed.

The vibration actuator 3 has a vibrator 4, an urging member 5 that urges the vibrator 4 toward the rotor 2, and a controller 7 that controls driving of the vibrator 4.

As shown in FIG. 2, the vibrator 4 has a vibrating portion 41, a supporting portion 42 supporting the vibrating portion 41, coupling portions 43 coupling the vibrating portion 41 and the supporting portion 42, and a distal end portion 44 coupled to the vibrating portion 41 and transmitting the vibration of the vibrating portion 41 to the rotor 2.

The vibrating portion 41 has a plate shape in thickness directions along the X-axis directions and spreading on a Y-Z plane containing the Y-axis and the Z-axis, and flexurally vibrates in S-shapes by expanding and contracting in the Y-axis directions and flexing in the Z-axis directions. Further, the vibrating portion 41 has a substantially rectangular shape with a long axis in the Y-axis directions as the expansion and contraction directions in a plan view from the X-axis direction. Note that the shape of the vibrating portion 41 is not particularly limited as long as the vibrating portion may fulfill the function thereof.

As shown in FIG. 2, the vibrating portion 41 has driving piezoelectric elements 6A to 6F for a flexural vibration of the vibrating portion 41 and a detection piezoelectric element 6G for detecting the vibration of the vibrating portion 41.

The piezoelectric elements 6C, 6D are placed along the longitudinal directions (Y-axis directions) of the vibrating portion 41 in the center part of the vibrating portion 41 in the Z-axis directions. The piezoelectric element 6C is located closer to the plus side in the Y-axis direction than the piezoelectric element 6D, and the piezoelectric element 6D is located closer to the minus side in the Y-axis direction than the piezoelectric element 6C. The piezoelectric element 6G is placed between the piezoelectric element 6C and the piezoelectric element 6D. The piezoelectric element 6C and the piezoelectric element 6D are electrically coupled to each other.

Note that, in place of the two piezoelectric elements 6C, 6D, a single piezoelectric element may be provided.

The piezoelectric elements 6A, 6B are placed adjacent to each other in the longitudinal directions of the vibrating portion 41 at the plus side of the vibrating portion 41 in the Z-axis direction with respect to the piezoelectric elements 6C, 6D, and the piezoelectric elements 6E, 6F are placed adjacent to each other in the longitudinal directions of the vibrating portion 41 at the minus side in the Z-axis direction. These piezoelectric elements 6A to 6F each expand and contract in the longitudinal directions of the vibrating portion 41 by energization. The piezoelectric elements 6A, 6F are electrically coupled to each other and the piezoelectric elements 6B, 6E are electrically coupled to each other. As will be described later, alternating-current voltages in different phases from each other at the same frequency as each other are applied to the piezoelectric elements 6C, 6D, the piezoelectric elements 6A, 6F, and the piezoelectric elements 6B, 6E and the expansion and contractions times of the elements are shifted, and thereby, the vibrating portion 41 may be flexurally vibrated in S-shapes within the plane thereof.

The piezoelectric element 6G is located between the piezoelectric element 6C and the piezoelectric element 6D. That is, the piezoelectric element 6G is placed adjacent to the piezoelectric elements 6C, 6D in the expansion and contraction directions thereof (Y-axis directions). The piezoelectric element 6G is subjected to an external force according to the vibration of the vibrating portion 41 with driving of the piezoelectric elements 6A to 6F, and outputs a signal according to the applied external force. Accordingly, the vibration state of the vibrating portion 41 may be sensed based on the signal output from the piezoelectric element 6G. Note that "the piezoelectric element 6G is placed adjacent to the piezoelectric elements 6C, 6D in the expansion and contraction directions thereof" means that at least a part of the piezoelectric element 6G is located within an area in which an area formed by extension of the piezoelectric element 6C in the expansion and contraction directions and an area formed by extension of the piezoelectric element 6D in the expansion and contraction directions overlap, and preferably means that the entire of the piezoelectric element 6G is located within the area.

Further, the piezoelectric element 6G is placed in a part as a node of the flexural vibration of the vibrating portion 41. The node of the flexural vibration is a part in which the amplitude in the Z-axis directions is substantially zero, i.e. a part in which the flexural vibration is not substantially generated. As described above, the piezoelectric element 6G is placed adjacent to the piezoelectric elements 6C, 6D in the expansion and contraction directions thereof and placed in the part containing the node of the flexural vibration of the vibrating portion 41, and thereby, the stretching vibration of the vibrating portion 41 in the Y-axis directions is easier to be transmitted to the piezoelectric element 6G and the flexural vibration of the vibrating portion 41 in the Z-axis directions is harder to be transmitted. That is, sensitivity for the flexural vibration may be made lower while sensitivity for the stretching vibration is made higher. Accordingly, the stretching vibration of the vibrating portion 41 in the Y-axis directions may be detected with higher accuracy by the piezoelectric element 6G.

Note that the placement of the piezoelectric element 6G is not particularly limited as long as the element may detect the stretching vibration of the vibrating portion 41 in the Y-axis directions, but may be placed, for example, in a part as an antinode of the flexural vibration of the vibrating portion 41. Or, the piezoelectric element 6G may be divided into a plurality of pieces.

The supporting portion 42 supports the vibrating portion 41. The supporting portion 42 has a U-shape surrounding the proximal end side, i.e., the minus side in the Y-axis direction of the vibrating portion 41 in the plan view from the X-axis direction. Note that the shape and the placement of the supporting portion 42 are not particularly limited as long as the portion may fulfill the function thereof.

The coupling portions 43 couple the part as the node of the flexural vibration of the vibrating portion 41, specifically, the center part of the vibrating portion 41 in the Y-axis directions and the supporting portion 42. Note that the configuration of the coupling portions 43 is not particularly limited as long as the portions may fulfill the function thereof.

The above described vibrating portion 41, supporting portion 42, and coupling portions 43 have a configuration formed by bonding of two piezoelectric element units 60 to face each other as shown in FIGS. 4 to 6. That is, in the sectional views shown in FIGS. 4 to 6, the configurations of the piezoelectric element units 60 have a mirror-image relationship with respect to a line passing through the midpoint of the configurations. Each piezoelectric element unit 60 has a substrate 61, driving piezoelectric elements 60A, 60B, 60C, 60D, 60E, 60F and a detection piezoelectric element 60G placed on the substrate 61, and a protective layer 63 covering the piezoelectric elements 60A to 60G. The protective layer 63 has an insulation property and may be referred to as "insulating part". The substrate 61 is not particularly limited, but e.g. a silicon substrate may be used. In the following description, of the two piezoelectric element units 60 shown in FIGS. 4 to 6, the piezoelectric element unit 60 located at the downside in the drawings will be representatively explained.

As shown in FIGS. 4 and 6, each of the piezoelectric elements 60A to 60F has a first electrode 601 placed on the substrate 61, a piezoelectric material 602 placed on the first electrode 601, and a second electrode 603 placed on the piezoelectric material 602. That is, the first electrodes 601 are placed on lower surfaces 6021 of the piezoelectric materials 602 and the second electrodes 603 are placed on upper surfaces 6022 of the piezoelectric materials 602. The first electrode 601, the piezoelectric material 602, and the second electrode 603 are provided in each of the piezoelectric elements 60A to 60F. That is, the first electrode 601 and the second electrode 603 are driving electrodes that vibrate the piezoelectric material 602 in each of the driving piezoelectric elements 60A to 60F based on drive signals.

On the other hand, as shown in FIG. 5, the piezoelectric element 60G has a third electrode 604 placed on the substrate 61, a piezoelectric material 602 placed on the third electrode 604, and a fourth electrode 606 placed on the piezoelectric material 602. That is, the third electrode 604 is provided on a lower surface 6021 of the piezoelectric material 602 and the fourth electrode 606 is provided on an upper surface 6022 of the piezoelectric material 602. The third electrode 604 is provided individually from the first electrodes 601 and the fourth electrode 606 is provided individually from the second electrodes 603. That is, the third electrode 604 and the fourth electrode 606 are detection electrodes that output detection signals according to the vibration of the piezoelectric material 602 of the detection piezoelectric element 60G to the controller 7, which will be described later.

The two piezoelectric element units 60 are joined via an adhesive 69 with the surfaces on which the piezoelectric elements 60A to 60G are placed facing each other. Note that the piezoelectric element unit 60 may be singly used. The number of bonded units is not limited to two, but may be three or more.

The first electrodes 601 of the respective piezoelectric elements 60A are electrically coupled via wires or the like (not shown). Further, the second electrodes 603 of the respective piezoelectric elements 60A are electrically coupled via wires or the like (not shown). These two piezoelectric elements 60A form the piezoelectric element 6A. The same applies to the other piezoelectric elements 60B to 60F, and the two piezoelectric elements 60B form the piezoelectric element 6B, the two piezoelectric elements 60C form the piezoelectric element 6C, the two piezoelectric elements 60D form the piezoelectric element 6D, the two piezoelectric elements 60E form the piezoelectric element 6E, and the two piezoelectric elements 60F form the piezoelectric element 6F.

Note that, in the embodiment, as shown in FIG. 3, the first electrodes 601 and the third electrode 604 are individual electrodes, however, these may be a single common electrode.

Further, the first electrodes 601, the second electrodes 603, the third electrode 604, and the fourth electrode 606 are electrically coupled to the controller 7 via wires (not shown). Note that FIG. 2 is the plan view showing the layer in which the second electrodes 603 and the fourth electrode 606 are provided, and FIG. 3 is the plan view showing the layer in which the first electrodes 601 and the third electrode 604 are provided.

On the other hand, the third electrodes 604 of the respective piezoelectric elements 60G are electrically coupled via wires or the like (not shown). Further, the fourth electrodes 606 of the respective piezoelectric elements 60G are electrically coupled via wires or the like (not shown). These two piezoelectric elements 60G form the piezoelectric element 6G.

The constituent material of the piezoelectric material 602 is not particularly limited, but piezoelectric ceramics including e.g. lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), leadmetaniobate, lead scandium niobate, etc. may be used. Or, as the piezoelectric material 602, polyvinylidene fluoride, crystal quartz, or the like may be used in addition to the above described piezoelectric ceramics.

The method of forming the piezoelectric material 602 is not particularly limited, but the material may be formed from a bulk material or formed using the sol-gel method or sputtering method. In the embodiment, the piezoelectric material 602 is formed using the sol-gel method. Thereby, for example, the thinner piezoelectric material 602 is obtained compared to the case where the material is formed from the bulk material, and the thickness of the vibration actuator 3 may be reduced.

The distal end portion 44 is provided at the distal end of the vibrating portion 41 and projects from the vibrating portion 41 toward the plus side in the Y-axis direction. The distal end portion 44 is in contact with the outer circumferential surface 21 of the rotor 2. Accordingly, the vibration of the vibrating portion 41 is transmitted to the rotor 2 via the distal end portion 44. The constituent material of the distal end portion 44 is not particularly limited to, but includes various kinds of ceramics such as zirconia, alumina, and titania. Thereby, the distal end portion 44 with better durability is obtained.

In the vibrator 4, when an alternating-current voltage V1 shown in FIG. 7 is applied to the piezoelectric elements 6A, 6F, an alternating-current voltage V2 is applied to the piezoelectric elements 6C, 6D, and an alternating-current voltage V3 is applied to the piezoelectric elements 6B, 6E, as shown in FIG. 8, the vibrating portion 41 flexurally vibrates in the Z-axis directions while stretchingly vibrating in the Y-axis directions. Concurrently, the alternating-current voltage V2 applied to the piezoelectric elements 6C, 6D generates a stretching vibration in the vibrating portion 41. On the other hand, the alternating-current voltage V1 applied to the piezoelectric elements 6A, 6F and the alternating-current voltage V3 applied to the piezoelectric elements 6B, 6E generate a flexural vibration in the vibrating portion 41. That is, the alternating-current voltage V2 is a stretching vibration drive signal generating the stretching vibration in the vibrating portion 41, and the alternating-current voltages V1, V3 are flexural vibration drive signals each generating the stretching vibration in the vibrating portion 41. Then, these vibrations are synthesized, and thereby, the distal end of the distal end portion 44 makes elliptic motion drawing an elliptical trajectory counterclockwise as shown by an arrow A1. Therefore, the alternating-current voltages V1, V2, V3 are drive signals Sd in the piezoelectric drive device 1. The rotor 2 is sent out by the elliptic motion of the distal end portion 44, and the rotor 2 rotates clockwise as shown by an arrow B1. In response to the vibration of the vibrating portion 41, a detection signal Ss is output from the piezoelectric element 6G.

Note that, in the elliptic motion of the distal end portion 44 shown by the arrow A1, the distal end portion 44 is in contact with the outer circumferential surface 21 of the rotor 2 and sends out the rotor 2 in the direction of the arrow B1 from a point A1' to a point A1", and the distal end portion 44 is separated from the outer circumferential surface 21 of the rotor 2 from the point A1" to the point A1'. Accordingly, the rotation of the rotor 2 toward the opposite side to the arrow B1 is suppressed from the point A1" to the point A1'.

When the alternating-current voltages V1, V3 are switched to each other, that is, when the alternating-current voltage V1 is applied to the piezoelectric elements 6B, 6E, the alternating-current voltage V2 is applied to the piezoelectric elements 6C, 6D, and the alternating-current voltage V3 is applied to the piezoelectric elements 6A, 6F, as shown in FIG. 9, the vibrating portion 41 flexurally vibrates in the Z-axis directions while stretchingly vibrating in the Y-axis directions. Also, in this case, the alternating-current voltage V2 applied to the piezoelectric elements 6C, 6D generates a stretching vibration in the vibrating portion 41. On the other hand, the alternating-current voltage V1 applied to the piezoelectric elements 6B, 6E and the alternating-current voltage V3 applied to the piezoelectric elements 6A, 6F generate a flexural vibration in the vibrating portion 41. Then, these vibrations are synthesized, and thereby, the distal end of the distal end portion 44 makes elliptic motion clockwise as shown by an arrow A2. The rotor 2 is sent out by the elliptic motion of the distal end portion 44, and the rotor 2 rotates counterclockwise as shown by an arrow B2. In response to the vibration of the vibrating portion 41, the detection signal Ss is output from the piezoelectric element 6G.

Note that, in the elliptic motion of the distal end portion 44 shown by the arrow A2, the distal end portion 44 is in contact with the outer circumferential surface 21 of the rotor 2 and sends out the rotor 2 in the direction of the arrow B2 from a point A2' to a point A2", and the distal end portion 44 is separated from the outer circumferential surface 21 of the rotor 2 from the point A2" to the point A2'. Accordingly, the rotation of the rotor 2 toward the opposite side to the arrow B2 is suppressed from the point A2" to the point A2'.

In the embodiment, the patterns of the alternating-current voltages applied to the piezoelectric elements 6A to 6F are not particularly limited as long as the rotor 2 may be rotated at least in one direction. Or, the voltages applied to the piezoelectric elements 6A to 6F may be, e.g., intermittently applied direct-current voltages or alternating voltage waveforms with zero amplitudes, not the alternating-current voltages.

As described above, the vibrating portion 41 includes the driving piezoelectric elements 6A to 6F (driving piezoelectric elements) having the piezoelectric materials 602 and the first electrodes 601 and the second electrodes 603 provided on the piezoelectric materials 602. The stretching vibration and the flexural vibration in the vibrating portion 41 are vibrations at the interfaces between the piezoelectric materials 602 and the first electrodes 601, i.e., in a planar surface parallel to the surfaces of the first electrodes 601.

Thereby, vibration efficiency in the vibrating portion 41 becomes higher and the piezoelectric drive device 1 with lower power consumption may be realized.

Note that "parallel" in this specification has a concept referring to a state in which an angle formed by the vibration surface of the above described stretching vibration and flexural vibration and the surface of the first electrode 601 is 0° and a state in which the angle is within a range of ±5°.

The distal end portion 44 may be provided as appropriate, and another member may be substituted for the portion.

The urging member 5 is a member that urges the distal end portion 44 toward the outer circumferential surface 21 of the rotor 2. As shown in FIG. 10, the urging member 5 has a first substrate 51 located at the upper surface side, i.e., the plus side in the X-axis direction of the vibrator 4 and a second substrate 52 located at the lower surface side, i.e., the minus side in the X-axis direction of the vibrator 4. The vibrator 4 is sandwiched by the first substrate 51 and the second substrate 52. The first substrate 51 and the second substrate 52 are not particularly limited, but e.g. silicon substrates may be used.

Here, in the embodiment, the single vibrator 4 is sandwiched by the first substrate 51 and the second substrate 52, however, for example, a configuration in which a stacking structure formed by stacking of a plurality of piezoelectric actuators 4 is sandwiched by the first substrate 51 and the second substrate 52 may be used. Thereby, the number of piezoelectric actuators 4 contained in the single vibration actuator 3 increases, and the rotor 2 may be rotated with greater torque by the increase.

As shown in FIG. 10, a spacer 53 having an equal thickness to the vibrator 4 is provided between supporting portions 512, 522. Further, in the part, a through hole 59 penetrating in the X-axis directions is formed, and the urging member 5 is fastened by a screw to a housing or the like using the through hole 59. The urging member 5 is fastened to a housing or the like with a spring portion 513 compressed in the Y-axis directions, and thereby, the distal end portion 44 may be urged toward the outer circumferential surface 21 of the rotor 2 using the restoring force of the spring portion 513.

Note that the configuration of the urging member 5 is not particularly limited as long as the member may urge the distal end portion 44 toward the outer circumferential surface 21 of the rotor 2. For example, one of the first substrate 51 and the second substrate 52 may be omitted. Or, for example, a coil spring, plate spring, or the like may be used as the urging member 5.

The controller 7 applies the alternating-current voltages V1, V2, V3 to the piezoelectric elements 6A to 6F, and thereby, controls driving of the vibration actuator 3.

As shown in FIG. 11, the controller 7 has a drive voltage control value generation unit 75, a drive signal generation circuit 72, and a detection signal processing circuit 71. The drive signal generation circuit 72 includes a PWM signal generation unit 72P that generates PWM signals Pd and a drive signal generation unit 72S that generates the drive signals Sd to be applied to the piezoelectric elements 6A, 6B, 6C, 6D, 6E, 6F from the PWM signals Pd. Further, the detection signal processing circuit 71 includes a detection pulse signal generation unit 71S that generates a detection pulse signal Ps by binarization of the detection signal Ss output from the piezoelectric element 6G, and a phase difference acquisition unit 71P that acquires phase differences between the PWM signals Pd and the detection pulse signal Ps. The drive voltage control value generation unit 75 generates a drive voltage control value for instructing generation of the PWM signals Pd to the PWM signal generation unit 72P. The above described drive signal generation circuit 72 determines the waveform (pulse width) of the PMW signals Pd based on the drive voltage control value. As below, the individual units will be described in detail.

The drive voltage control value generation unit 75 generates and outputs the drive voltage control value for controlling driving of the PWM signal generation unit 72P. In this regard, the drive voltage control value generation unit 75 adjusts the output frequency of the drive voltage control value based on the phase differences acquired by the phase difference acquisition unit 71P so that the phase differences may be closer to a target value.

Further, the drive voltage control value generation unit 75 includes an amplitude modulation signal generation part 752. The amplitude modulation signal generation part 752 generates the drive voltage control value for generation of the amplitude-modulated alternating-current voltage V2 and outputs the value toward the PWM signal generation unit 72P.

The PWM signal generation unit 72P generates the PWM signals Pd for generation of the drive signals Sd. As shown in FIG. 11, the PWM signals Pd generated in the PWM signal generation unit 72P are rectangular waves binarized at High and Low. The PWM signal generation unit 72P may change duties of the PWM signals Pd. The duties of the PWM signals Pd are changed, and thereby, amplitudes of the drive signals Sd may be changed. For example, when the duty is 50%, the amplitude of the drive signal Sd is the maximum and, as the Duty is made closer to 0%, the amplitude of the drive signal Sd decreases.

Note that the configuration of the PWM signal generation unit 72P is not particularly limited as long as the unit may generate the above described PWM signals Pd and change the duties of the PWM signals Pd. As shown in FIG. 11, the PWM signal generation unit 72P has a first PWM signal generation part 721P, a second PWM signal generation part 722P, and a third PWM signal generation part 723P for generation of different three drive signals, e.g. the alternating-current voltages V1, V2, V3 and signals in different phases.

The drive signal generation unit 72S generates the drive signals Sd as analog signals from the PWM signals Pd generated in the PWM signal generation unit 72P. As shown in FIG. 11, the drive signals Sd generated in the drive signal generation unit 72S are substantially sinusoidal wave signals.

Note that the configuration of the drive signal generation unit 72S is not particularly limited as long as the unit may generate the above described drive signals Sd. The drive signal generation unit 72S according to the embodiment has a first drive signal generation part 721S coupled to the first PWM signal generation part 721P, a second drive signal generation part 722S coupled to the second PWM signal generation part 722P, and a third drive signal generation part 723S coupled to the third PWM signal generation part 723P for generation of different three drive signals, e.g. the alternating-current voltages V1, V2, V3 and signals in different phases.

The three drive signals generated by the drive signal generation unit 72S, here, the alternating-current voltages V1, V2, V3 are applied to the piezoelectric elements 6A, 6B, 6C, 6D, 6E, 6F, and thereby, as described above, the vibrating portion 41 performs a stretching vibration and a flexural vibration and the rotor 2 rotates with the vibrations.

The detection pulse signal generation unit 71S generates the detection pulse signal Ps as a digital signal by binarization of the detection signal Ss as an analog signal output from the piezoelectric element 6G with the flexural vibration of the vibrating portion 41. As shown in FIG. 11, the detection signal Ss output from the piezoelectric element 6G is a substantially sinusoidal wave signal corresponding to the amplitude of the vibrating portion 41, and the detection pulse signal Ps is a rectangular wave signal formed by binarization of the detection signal Ss at High and Low. Note that the configuration of the detection pulse signal generation unit 71S is not particularly limited as long as the unit may generate the above described detection pulse signal Ps.

The phase difference acquisition unit 71P is a circuit that acquires the phase differences between the PWM signals Pd and the detection pulse signal Ps. As described above, the phase differences are acquired, and thereby, the vibration state of the vibrating portion 41 may be monitored.

In the above described manner, driving of the vibration actuator 3 may be controlled.

Here, the driving of the rotor 2 by the vibration actuator 3 has the following problems.

As described above, the rotor 2 has the circular disk shape, however, in the manufacturing technology, it is extremely difficult to conform the plan view shape to a perfect circle, and the outer circumferential surface 21 is partially worn during use and the plan view shape may be out of the perfect circle. That is, the degree of circularity may be lower. When the rotor 2 is out of the perfect circle, the radius fluctuates in the respective parts of the outer circumferential surface 21, and a separation distance between the outer circumferential surface 21 and the distal end portion 44 from the point A1″ to the point A1′ of the arrow A1, i.e., a separation distance D shown in FIG. 12 fluctuates in the respective parts in the circumferential direction of the outer circumferential surface 21. When the separation distance D fluctuates, the sending force for the rotor 2 by the elliptic motion of the distal end portion 44 generated from the point A1″ to the point A1′ fluctuates with the fluctuations, and the rotation of the rotor 2 becomes unstable. Note that, as shown in FIG. 12, the separation distance D refers to a separation distance between the distal end portion 44 and the outer circumferential surface 21 at a bottom dead center P0 of the distal end portion 44 in the elliptic motion, i.e., a point farthest from the outer circumferential surface 21.

When the piezoelectric elements 6A, 6B, 6E, 6F are expanded and contracted by the controller 7, the distal end portion 44 flexurally vibrates in the Z-axis directions and sends the rotor 2 in the direction of the arrow B1. In this regard, the amplitude of the alternating-current voltage V1 applied to the piezoelectric elements 6A, 6F and the amplitude of the alternating-current voltage V3 applied to the piezoelectric elements 6B, 6E are controlled, and thereby, the drive speed of the rotor 2 may be controlled. Specifically, when the amplitudes of the alternating-current voltages V1, V3 are increased, the amplitude of the distal end portion 44 in the Z-axis directions increases and the drive speed of the rotor 2 increases. On the other hand, when the amplitudes of the alternating-current voltages V1, V3 are decreased, the amplitude of the distal end portion 44 in the Z-axis directions decreases and the drive speed of the rotor 2 decreases.

When the piezoelectric elements 6C, 6D are expanded and contracted by the controller 7, the distal end portion 44 stretchingly vibrates in the Y-axis directions. In this regard, the amplitude of the alternating-current voltage V2 applied to the piezoelectric elements 6C, 6D is controlled, and thereby, the separation distance D may be controlled. Specifically, when the alternating-current voltage V2 is increased, the amplitude of the separation distance D increases, and, when the amplitude of the alternating-current voltage V2 is decreased, the separation distance D decreases.

When the amplitude of the alternating-current voltage V2 is increased, if the plan view shape of the rotor 2 is out of the perfect circle, the fluctuation range of the radius, i.e., disturbances thereby may be easily absorbed by the separation distance D. Accordingly, the amplitude of the alternating-current voltage V2 is increased, and thereby, the sending force for the rotor 2 by the elliptic motion of the distal end portion 44 may be easily adjusted and the rotation of the rotor 2 may be stabilized.

Or, when the amplitude of the alternating-current voltage V2 is decreased, some fluctuation ranges of the radius may not completely be absorbed by the separation distance D. In this case, the separation distance D may be zero and the rotation of the rotor 2 may be unstable.

Accordingly, in the controller 7, the amplitude of the alternating-current voltage V2 (stretching vibration drive signal) is appropriately adjusted and the separation distance D is controlled, and thereby, the sending force for the rotor 2 by the elliptic motion of the distal end portion 44 is adjusted. Thereby, the piezoelectric drive device 1 that can smoothly drive with the stabilized rotation of the rotor 2 is obtained.

On the other hand, when the rotor 2 continues to rotate, the rotation of the rotor 2 is harder to be unstable, however, when the rotation is started from the state in which the rotation of the rotor 2 is stopped, the rotation of the rotor 2 is particularly likely to be unstable. This is because the rotor 2 is stopped with the distal end portion 44 pressed against the rotor 2 by the urging member 5, and the elliptic motion is hard to be started in the distal end portion 44. For the problem, in related art, control to start the elliptic motion in the distal end portion 44 by "down-sweep" of simultaneously applying the alternating-current voltages V1, V2, V3 and gradually decreasing the frequencies of the applied alternating-current voltages V1, V2, V3 is performed. However, according to the method of related art, there is a problem that the time to gradually decrease the frequencies of the alternating-current voltages V1, V2, V3 is necessary, and the time until the start of the elliptic motion in the distal end portion 44 is longer. That is, there is a problem of time lag after the rotor 2 stops and before actually starting to rotate.

Accordingly, in the embodiment, control to continue to apply the alternating-current voltage V2 to the piezoelectric elements 6C, 6D even when the rotor 2 is stopped is performed. In other words, for starting the rotation of the rotor 2, the application of the alternating-current voltage V2 to the piezoelectric elements 6C, 6D is started before the start of rotation, and then, the application of the alternating-current voltage V1 to the piezoelectric elements 6A, 6F and the application of the alternating-current voltage V3 to the piezoelectric elements 6B, 6E are each started at the time desired to actually start the rotation of the rotor 2. The piezoelectric drive device 1 is controlled in the above described manner, and thereby, even when the rotor 2 is stopped, the separation distance D to some degree may be held between the distal end portion 44 and the rotor 2. Therefore, at the time desired to start the rotation of the rotor 2, the elliptic motion can be produced in the distal end portion B4 and the rotor 2 can be rotated with less time lag.

Under the condition, to further reduce the time lag, it is desirable to secure the separation distance D between the distal end portion 44 and the rotor 2 to be sufficiently larger. Thereby, as described above, even when there is a fluctuation range of the radius of the outer circumferential surface 21 of the rotor 2, the fluctuation range may be sufficiently absorbed by the separation distance D and the rotor 2 may be smoothly sent by the elliptic motion of the distal end portion 44. As a result, the above described time lag may be further reduced. However, on the other hand, when the amplitude of the alternating-current voltage V2 is uniformly increased, a problem of increase in power consumption arises.

Accordingly, in the embodiment, control to superimpose a modulation signal on the alternating-current voltage V2 (stretching vibration drive signal) is further performed. Specifically, in the controller 7 according to the embodiment, the amplitude modulation signal generation part 752 is provided in the drive voltage control value generation unit 75, and the amplitude modulation signal generation part 752 controls to superimpose a modulation signal for modulating the amplitude on the alternating-current voltage V2 applied when the rotor 2 is stopped. The amplitude modulation is performed, and thereby, compared to the case where the amplitude of the alternating-current voltage V2 is uniformly increased, the power consumption may be reduced. Further, the modulation signal generated in the amplitude modulation signal generation part 752 is appropriately set, and thereby, control to temporarily generate a larger amplitude can be performed. The larger amplitude is temporarily generated, and thereby, the separation distance D between the distal end portion 44 and the rotor 2 may be temporarily increased without significant increase in power consumption. The temporary increase of the separation distance D serves to facilitate production of the elliptic motion of the distal end portion 44 as a trigger. As a result, the rotation of the rotor 2 may be smoothly started with reduced power consumption. In other words, the piezoelectric drive device 1 that can normally drive at intended times with reduced power consumption is obtained.

Note that, when the rotor 2 is stopped, the application of the alternating-current voltages V1, V3 (flexural vibration drive signals) is stopped. Then, application of these alternating-current voltages V1, V3 may be started at the time desired to start the rotation of the rotor 2. Note that the time to start the application of the alternating-current voltage V1 and the time to start the application of the alternating-current voltage V3 may be the same as each other or different.

As described above, the piezoelectric drive device 1 includes the vibrators 4 (piezoelectric vibrators) having the vibrating portion 41 and the distal end portion 44 coupled to the vibrating portion 41, in which the distal end portion 44 makes elliptic motion by the stretching vibration and the flexural vibration of the vibrating portion 41, the rotor 2 (driven member) driven by the elliptic motion of the distal end portion 44, and the drive signal generation circuit 72 outputting the alternating-current voltage V2 as the stretching vibration drive signal that generates the stretching vibration in the vibrators 4 and the alternating-current voltages V1, V3 as the flexural vibration drive signals that generate the flexural vibration. In the control method therefor, even when the rotor 2 is stopped, the drive signal generation circuit 72 controls to superimpose and output the modulation signal for amplitude modification on the alternating-current voltage V2. In other words, the drive signal generation circuit 72 is configured to superimpose and output the modulation signal for amplitude modification on the alternating-current voltage V2 even when the rotor 2 is stopped.

According to the piezoelectric drive device 1 including the drive signal generation circuit 72 to which the control method can be applied, the rotation of the rotor 2 may be smoothly started with reduced power consumption. As a result, the piezoelectric drive device 1 that can normally drive at intended times with reduced power consumption is obtained.

It is preferable that the modulation of the alternating-current voltage V2 is amplitude modulation using a modulation signal having periodicity. The periodicity is provided, and thereby, control to generate a large amplitude in the alternating-current voltage V2 on a regular basis can be performed. As a result, even when the separation distance D is not sufficiently secured with reduced power consumption, the separation distance D may be increased in a constant period. Accordingly, the elliptic motion of the distal end portion 44 is produced with the timing and the rotation of the rotor 2 may be smoothly started. That is, the elliptic motion of the distal end portion 44 may be started after one period of the modulation signal at the latest.

Therefore, the period in the modulation signal having periodicity determines the frequency at which the large amplitude is generated on the regular basis. In other words, the generation frequency of the large amplitude may be adjusted by the period of the modulation signal. Thereby, the reduction amount of the power consumption and the accuracy of driving of the rotor 2 may be easily balanced.

The modulation signal in the amplitude modulation of the alternating-current voltage V2 is not particularly limited, but a modulation signal based on a random number is used in the embodiment. That is, in the alternating-current voltage V2 as the drive signal Sd that generates the stretching vibration, the modulation signal based on the random number is superimposed on the basic signal obtained form the phase difference output from the phase difference acquisition unit 71P. The random number is used as the modulation signal, and thereby, the modulation signal for generating the large amplitude on the regular basis may be easily generated with the average amplitude suppressed to be small. As a result, the alternating-current voltage V2 that may smoothly start the rotation of the rotor 2 may be easily generated with reduced power consumption.

Figure 13:
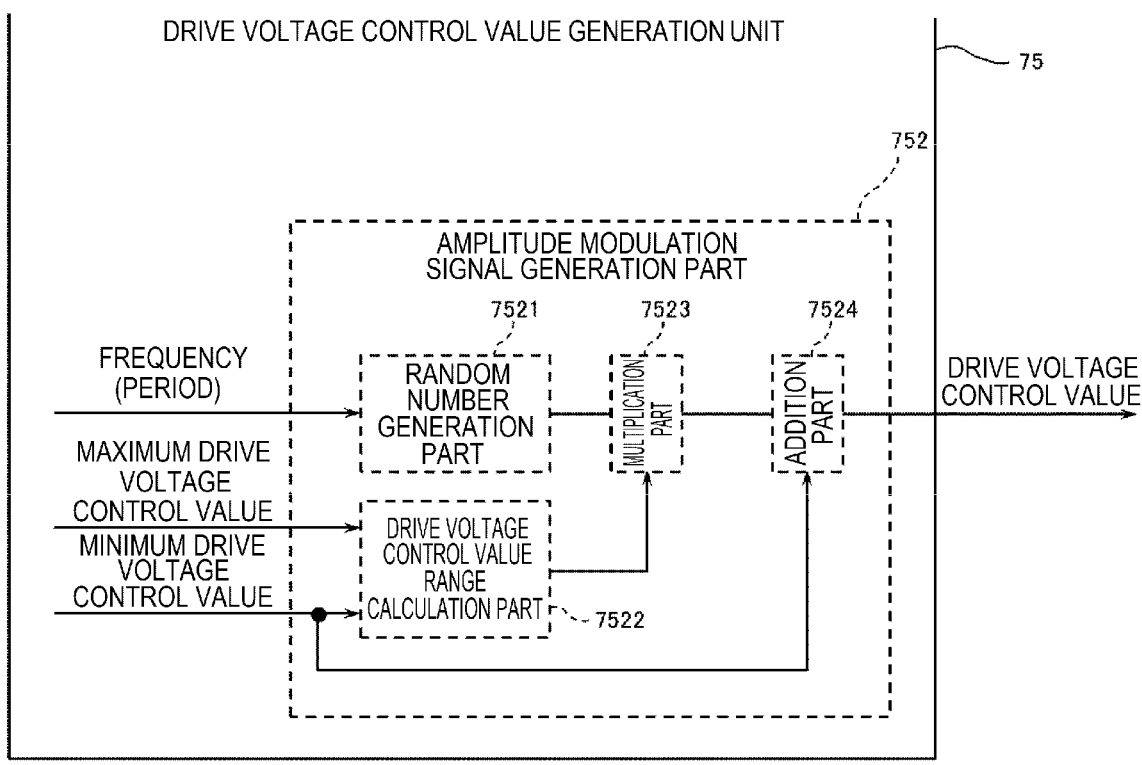
FIG. 13 is a block diagram in which a random number generation part is mounted in an amplitude modulation signal generation unit shown in FIG. 11.

FIG. 13 is the block diagram in which a random number generation part 7521 is mounted in the amplitude modulation signal generation part 752 shown in FIG. 11. The amplitude modulation signal generation part 752 shown in FIG. 13 includes the above described random number generation part 7521, a drive voltage control value range calculation part 7522 that sets a range of the drive voltage control value, a multiplication part 7523, and an addition part 7524.

Of the parts, in the random number generation part 7521, random numbers within a predetermined range are generated by calculation. The generation method of the random numbers by calculation is not particularly limited, but e.g. pseudo-random numbers of the M-sequence are preferably used. The M-sequence is used, and thereby, the pseudo-random numbers in which all elements periodically appear within a set range may be easily generated by calculation using a computer. Therefore, the pseudo-random numbers are useful as the modulation signals for the alternating-current voltage V2.

On the other hand, in the drive voltage control value generation unit 75, the frequencies and periods to be reflected on the alternating-current voltages V1, V2, V3 are calculated based on the phase differences output from the phase difference acquisition unit 71P. Then, regarding the alternating-current voltages V1, V3 as the flexural vibration drive signals, the drive voltage control values appropriately obtained are output. Regarding the alternating-current voltage V2, in the random number generation part 7521, the modulation signals based on the generated random numbers are superimposed in the calculated period. Thereby, the drive voltage control value to which one random number corresponds may be superimposed on one waveform of the alternating-current voltage V2. The alternating-current voltage V2 is generated based on the drive voltage control value, and thereby, the above described effect, i.e., the effect that, when the rotation of the rotor 2 in the stopped state is started, the rotation may be smoothly started and the power consumption is reduced may be exerted more reliably.

Note that, as an example, when the frequency of the alternating-current voltage V2 is 330 kHz, the period is 3.03 µs. In this case, in the random number generation part 7521, the random numbers may be generated in the period of 3.03 µs. The generated random numbers are input to the multiplication part 7523.

Further, the drive voltage control value range calculation part 7522 calculates a range of the drive voltage control value that provides an acceptable amplitude to the alternating-current voltage V2. The maximum drive voltage value may be derived from the maximum amplitude of the alternating-current voltage V2 acceptable in the piezoelectric drive device 1. Note that the drive voltage control value providing the maximum drive voltage value is referred to as "maximum drive voltage control value". The maximum drive voltage control value may be externally input or stored in the drive voltage control value generation unit 75.

On the other hand, the minimum drive voltage value is the minimum amplitude for expression of the effect that, when the rotor 2 is stopped as described above, the rotation of the rotor 2 may be smoothly started by application of the alternating-current voltage V2. The drive voltage control value providing the minimum drive voltage value is referred to as "minimum drive voltage control value". For the minimum drive voltage control value, a predetermined numeric value externally input or stored in the drive voltage control value generation unit 75 may be used, however, a numeric value obtained in advance in the actual driving of the piezoelectric drive device 1 may be used because the value is different depending on disturbances including the shape of the rotor 2, the surface condition of the outer circumferential surface 21, and the wear condition of the distal end portion 44.

As below, a method of obtaining the minimum drive voltage control value will be explained.

Figure 14:
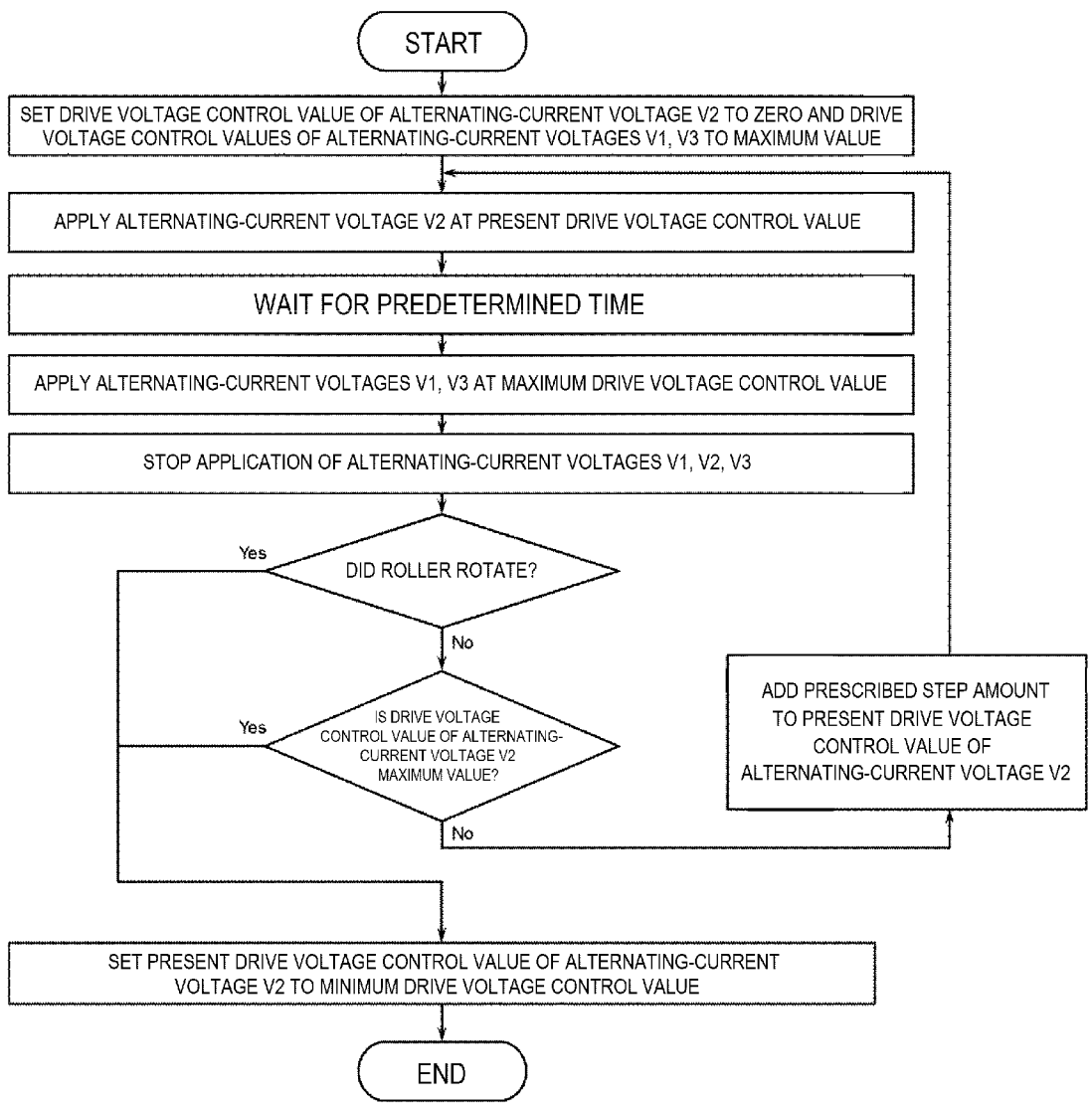
FIG. 14 is a flowchart for explanation of a method of obtaining a minimum drive voltage control value.

FIG. 14 is the flowchart for explanation of the method of obtaining the minimum drive voltage control value. As shown in FIG. 14, first, the drive voltage control value of the alternating-current voltage V2 is set to zero and the drive voltage control values of the alternating-current voltages V1, V3 are set to the maximum value. Note that the maximum value (maximum amplitude) of the alternating-current voltages V1, V3 is obtained in the same manner as that for the above described maximum amplitude of the alternating-current voltage V2. Then, the alternating-current voltage V2 by the present drive voltage control value is applied to the piezoelectric elements 6C, 6D. Then, the application of the alternating-current voltage V2 is left for a fixed time. The time to leave is not particularly limited, but e.g. from 0.1 seconds to 10 seconds. The time to leave may stabilize the stretching vibration generated by the application of the alternating-current voltage V2.

Then, the alternating-current voltage V1 is applied to the piezoelectric elements 6A, 6F, and the alternating-current voltage V3 is applied to the piezoelectric elements 6B, 6E.

Then, the application of the alternating-current voltages V1, V2, V3 is stopped. Whether or not the rotor 2 rotated from the start of the application to the stop of the application of the alternating-current voltage V2 is checked based on the encoder or the like. When the rotor 2 rotated, the present drive voltage control value of the alternating-current voltage V2 is set to the minimum drive voltage control value. On the other hand, when the rotor 2 did not rotate, whether or not the present drive voltage control value of the alternating-current voltage V2 is the maximum value is checked. When the present drive voltage control value of the alternating-current voltage V2 is the maximum value, the maximum value of the drive voltage control value is the minimum drive voltage control value. Or, when the present drive voltage control value of the alternating-current voltage V2 is not the maximum value, a prescribed step amount is added to the present drive voltage control value of the alternating-current voltage V2. The prescribed step amount is not particularly limited, but e.g. the minimum value that can be set as the drive voltage control value of the alternating-current voltage V2 in the piezoelectric drive device 1, or a value larger than the value. Then, the flow is returned to immediately before the step of applying the alternating-current voltage V2 at the present drive voltage control value.

Note that, for example, when the precision of the PWM signal Pd is 12 bits, the maximum drive voltage control value for providing the maximum drive voltage value of the alternating-current voltage V2 is "4095". As a result of the execution of the flow, here, a value "1095" is used as the minimum drive voltage control value as an example.

In the above described manner, the minimum drive voltage control value may be obtained. The minimum drive voltage value of the alternating-current voltage V2 based on the obtained minimum drive voltage control value is the minimum voltage value having a high probability of producing the elliptic motion in the distal end portion 44 even when the rotor 2 is stopped and disturbances exist. Accordingly, the alternating-current voltage V2 having an amplitude larger than the minimum drive voltage value is applied, and thereby, a high probability of producing elliptic motion in the distal end portion 44 and starting the rotation of the rotor 2 even when the rotor 2 is stopped may be secured.

Thus obtained minimum drive voltage control value is input to the drive voltage control value range calculation part 7522 shown in FIG. 13 together with the maximum drive voltage control value. In the drive voltage control value range calculation part 7522, a difference between the input maximum drive voltage control value and minimum drive voltage control value is calculated. The difference is the drive voltage control value range. The calculated drive voltage control value range is input to the multiplication part 7523. Here, as an example, the difference "3000" between the maximum drive voltage control value "4095" and the minimum drive voltage control value "1095" is the drive voltage control value range.

Then, in the multiplication part 7523 shown in FIG. 13, the random number generated in the random number generation part 7521 is multiplied by the drive voltage control value range obtained in the drive voltage control value range calculation part 7522, and thereby, a product is calculated. The calculated product is input to the addition part 7524 as a new signal.

Then, in the addition part 7524 shown in FIG. 13, the product calculated in the multiplication part 7523 and the above described minimum drive voltage control value are added, and thereby, a sum is calculated. The sum is the drive voltage control value for instruction of generation of the PWM signal Pd that determines the amplitude of the alternating-current voltage V2. The obtained drive voltage control value for the alternating-current voltage V2 is input to the second PWM signal generation part 722P of the PWM signal generation unit 72P.

Then, when the PWM signal Pd generated in the second PWM signal generation part 722P is input to the second drive signal generation part 722S, the alternating-current voltage V2 with the modulation signal based on the random number superimposed thereon is generated.

Note that, when the modulation signals having the periodicity like pseudo-random numbers of the M-sequence are used, as described above, all elements appear within a certain period. For example, in the case of the pseudo-random numbers set in a range from 0.0 to 1.0, when the period corresponds to 4096 elements, 3.03 μs×4096=12.4 ms and the maximum value "1.0" appears once in the unit time of 12.4 ms. The product calculated in the multiplication part 7523 at the time when "1.0" appears is 1.0×3000=3000. Then, in the addition part 7524, 3000+1095=4095. As a result, the drive voltage control value output from the drive voltage control value generation unit 75 is "4095" equal to the drive voltage control value "4095". Consequently, the amplitude of the alternating-current voltage V2 output from the drive signal generation unit 72S at the time is the maximum drive voltage value. Therefore, the waveform of the alternating-current voltage V2 generated using the pseudo-random numbers is a waveform in which the maximum drive voltage value appears once in the unit time of 12.4 ms.

The maximum drive voltage value appears as described above, and thereby, for example, even under a condition that the start of the rotation of the rotor 2 is difficult with the amplitude less than the maximum drive voltage value, the rotation of the rotor 2 may be started with a higher probability. Therefore, the piezoelectric drive device 1 that may secure the start of the rotation of the rotor 2 may be realized.

Note that the period with which the maximum drive voltage value appears, i.e., the period in the modulation signal having periodicity is appropriately set according to the conditions of the vibrator 4 and the rotor 2, environmental conditions, or the like. As an example, the period is preferably set in a range from 10 times to 1000000 times the period of the alternating-current voltage V2.

Figure 15:
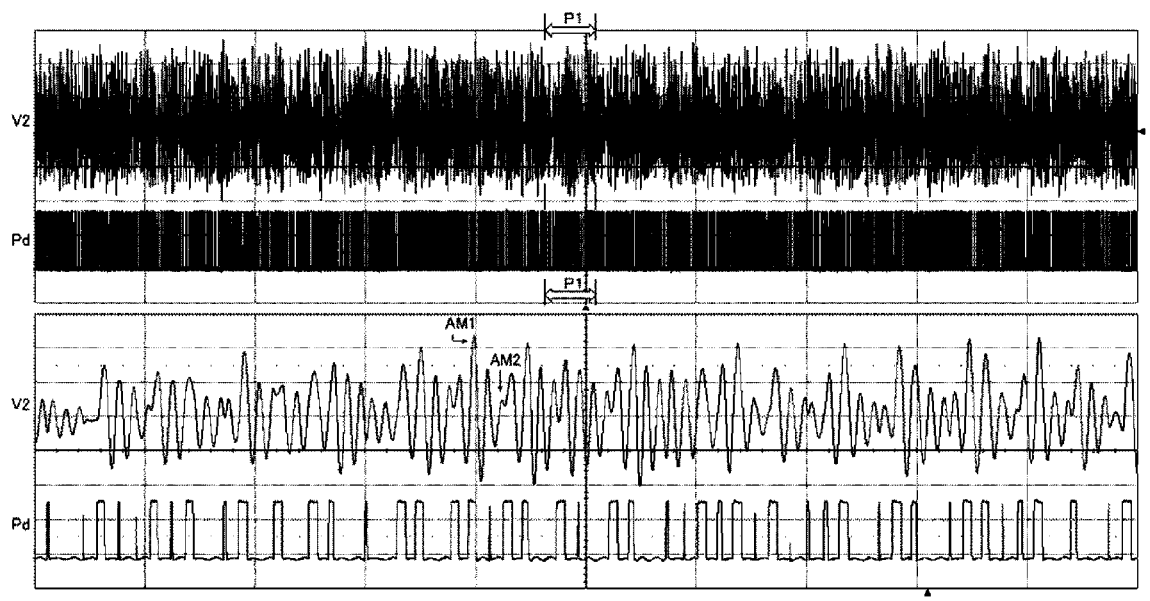
FIG. 15 shows examples of waveforms of alternating-current voltages V2 on which modulation signals based on random numbers are superimposed and examples of waveforms of PWM signals Pd generating the alternating-current voltages V2.

Here, FIG. 15 shows the examples of waveforms of alternating-current voltages V2 on which modulation signals based on random numbers are superimposed and the examples of waveforms of PWM signals Pd generating the alternating-current voltages V2. Note that FIG. 15 shows the four waveforms in total, and the top waveform is the waveform of the alternating-current voltage V2 on which the modulation signals based on the random numbers are superimposed, and the third waveform from the top is the partially enlarged view of the P1 part. Further, the second top waveform is the waveform of the PWM signal Pd for generating the alternating-current voltage V2 on which the modulation signals based on the random numbers are superimposed, and the fourth waveform from the top is the partially enlarged view of the P1.

Figure 16:
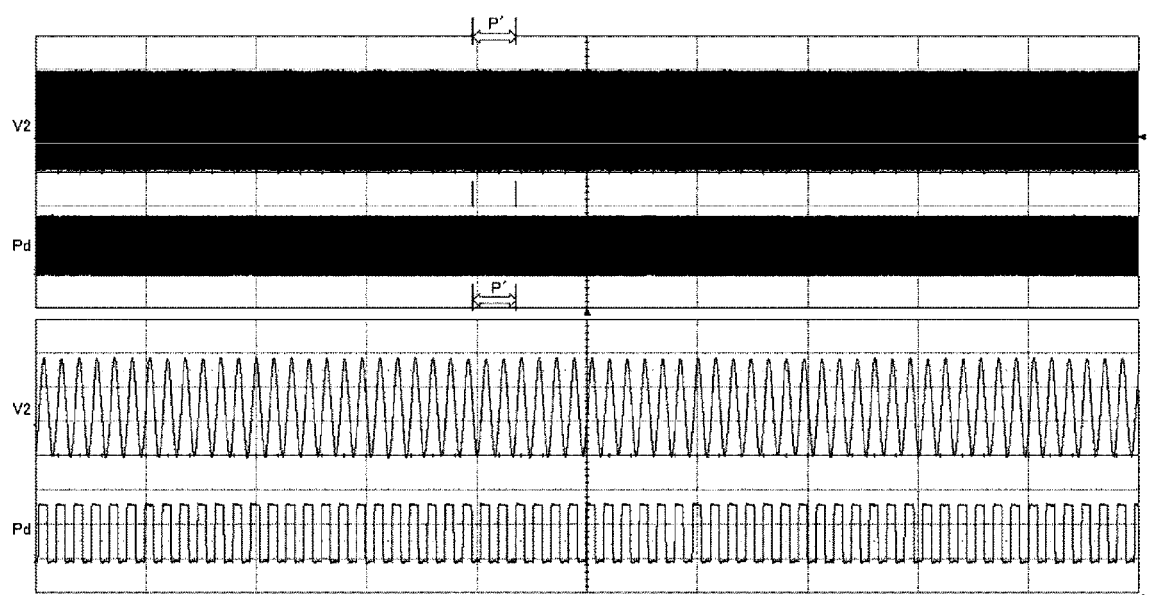
FIG. 16 shows examples of waveforms of alternating-current voltages V2 on which modulation signals are not superimposed and examples of waveforms of PWM signals Pd generating the alternating-current voltages V2 for comparison to FIG. 15.

On the other hand, FIG. 16 shows the examples of waveforms of alternating-current voltages V2 on which modulation signals are not superimposed and examples of waveforms of PWM signals Pd generating the alternating-current voltages V2 for comparison to FIG. 15. Note that FIG. 16 also shows the four waveforms in total, and the top waveform is the waveform of the alternating-current voltage V2 without amplitude modulation, and the third waveform from the top is the partially enlarged view of a P' part of the top waveform. Further, the second top waveform is the waveform of the PWM signal Pd for generating the alternating-current voltage V2 without amplitude modulation, and the fourth waveform from the top is the partially enlarged view of a P' part of the second top waveform.

As shown in FIG. 15, in the waveforms of the alternating-current voltage V2 on which the modulation signals based on the random numbers are superimposed, the amplitude changes with respect to each waveform and larger amplitudes AM1 and smaller amplitudes AM2 are mixed. With the waveforms, for example, compared to the case where the large amplitudes constantly continue as shown in FIG. 16, power consumption may be reduced. Further, it is recognized that the larger amplitudes AM1 appear at longer time intervals than the single waveform period. The alternating-current voltage V2 is applied to the vibrator 4, and thereby, for example, even when the rotor 2 is stopped and disturbances exist, the rotation of the rotor 2 may be smoothly started.

Note that, in the embodiment, the random numbers are used as the modulation signals for amplitude modulation, however, the modulation signals are not limited to those. Any modulation signals including signals, which will be described later, may be used. Further, the drive signals Sd that generate the stretching vibration, i.e., the modulation signals superimposed on the alternating-current voltage V2 may be constantly fixed or changed with time. The changes can be made, and thereby, the modulation signals can be changed to optimum modulation signals according to the usage, the usage environments, degree of deterioration, etc. of the piezoelectric drive device 1. As a result, more stable driving and reduction of power consumption may be balanced.

The piezoelectric drive device 1 according to the embodiment includes the vibrator 4 (piezoelectric vibrator) having the vibrating portion 41 and the distal end portion 44 coupled to the vibrating portion 41, in which the distal end portion 44 makes elliptic motion by the stretching vibration and the flexural vibration of the vibrating portion 41, and the rotor 2 (driven member) driven by the elliptic motion of the distal end portion 44. When the rotor 2 (driven member) is stopped, as described above, the vibrator 4 performs the stretching vibration having the amplitude AM1 (first amplitude) and the amplitude AM2 (second amplitude) different from the amplitude AM1.

According to the piezoelectric drive device 1, even when the rotor 2 is stopped and disturbances exist, the rotation of the rotor 2 may be smoothly started with reduced power consumption. As a result, the piezoelectric drive device 1 that can normally drive at intended times with reduced power consumption is obtained.

Note that, in the example shown in FIG. 15, the amplitude AM1 is the maximum amplitude, i.e., the maximum drive voltage value and the amplitude AM2 is the minimum amplitude, i.e., the minimum drive voltage value. When the amplitudes AM1, AM2 are set as described above, the amplitudes AM1, AM2 are determined based on the above described maximum drive voltage control value and minimum drive voltage control value. Accordingly, "ratio of amplitude AM2/amplitude AM1" expressing the magnitude relationship between the values is obtained based on actual measurement, but not particularly limited. In the embodiment, the ratio is 1095/4095 & 0.27. In consideration of the better balance between stable driving and reduction of power consumption, the ratio of amplitude AM2/amplitude AM1 is preferably from 0.10 to 0.50.

The controller 7 includes a computer having e.g. a processor such as a CPU, memory, interface, etc. The processor executes predetermined programs stored in the memory, and thereby, controls operations of the individual parts. Note that the programs may be externally downloaded via the interface. All or part of the configurations of the controller 7 may be provided outside of the piezoelectric drive device 1 and connected via a communication network such as a LAN (local area network).

Second Embodiment

Next, a piezoelectric drive device according to the second embodiment will be explained.

Figure 17:
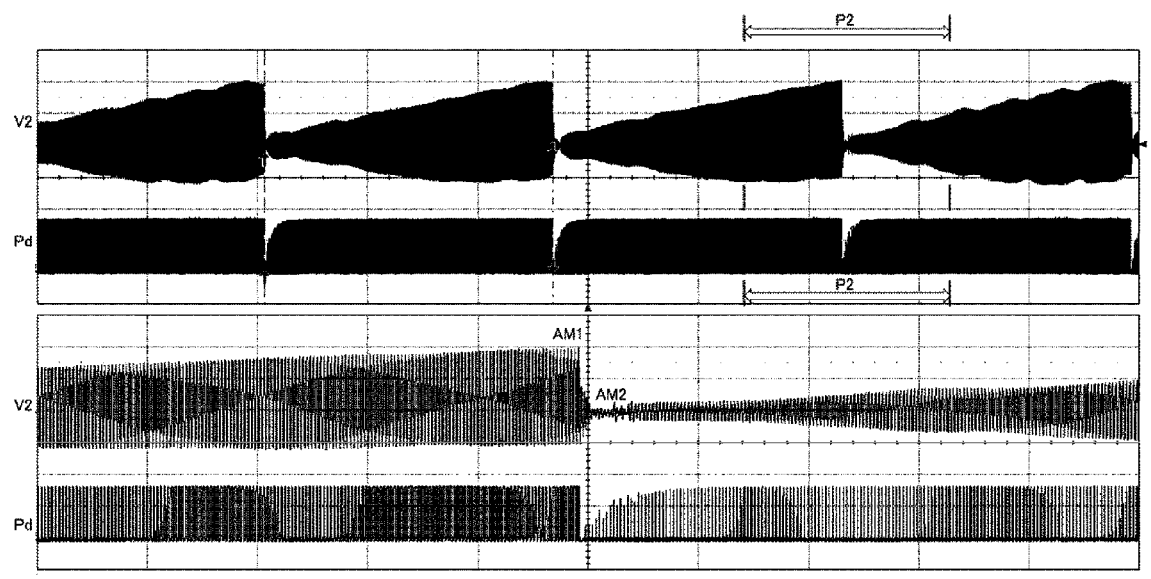
FIG. 17 shows examples of waveforms of alternating-current voltages V2 on which modulation signals based on ramp waves are superimposed and examples of waveforms of PWM signals Pd generating the alternating-current voltages V2.

FIG. 17 shows the examples of waveforms of alternating-current voltages V2 on which modulation signals based on ramp waves are superimposed and the examples of waveforms of PWM signals Pd generating the alternating-current voltages V2. Note that FIG. 17 shows the four waveforms in total, and the top waveform is the waveform of the alternating-current voltage V2 on which the modulation signals based on the ramp waves are superimposed, and the third waveform from the top is the partially enlarged view of a P2 part of the top waveform. Further, the second top waveform is the waveform of the PWM signal Pd for generating the alternating-current voltage V2 on which the modulation signals based on the ramp waves are superimposed, and the fourth waveform from the top is the partially enlarged view of a P2 part of the second top waveform.

As below, the second embodiment will be explained, and the explanation will be made with a focus on differences from the above described embodiment and the explanation of the same items will be omitted. In FIG. 17, the same configurations as those of the above described embodiment have the same signs.

The second embodiment is the same as the first embodiment except that the waveforms of the alternating-current voltages V2 are different. That is, the alternating-current voltage V2 shown in FIG. 17 as the drive signal generating the stretching vibration in the vibrating portion 41 has a waveform on which the modulation signals based on the ramp waves are superimposed. The ramp wave is also called sawtooth wave and has a waveform in which the amplitude gradually increases with time and sharply decreases. In the alternating-current voltage V2 shown in FIG. 17, the amplitude change that the amplitude gradually increases with time, reaches the maximum value, and sharply decreases is repeated with a fixed period. That is, also, in the alternating-current voltages V2 shown in FIG. 17, like the alternating-current voltages V2 shown in FIG. 15, the larger amplitudes AM1 and the smaller amplitudes AM2 are mixed.

The modulation signals generating the alternating-current voltage V2 shown in FIG. 17 may be easily generated using a resettable counter. That is, for generation of the alternating-current voltage V2 shown in FIG. 17, the resettable counter may be mounted in place of the random number generation part 7521 shown in FIG. 13. The resettable counter is provided, and thereby, for example, modulation signals having periodicity that numeric values gradually increasing from 0.0 to 1.0 are generated, with the counter reset, and then, the same numeric values are generated again may be generated. For example, when the frequency of the alternating-current voltage V2 is 330 kHz, the period is 3.03 s. In this case, in the resettable counter, the numeric values may be generated with the period of 3.03 μs.

Also, in the second embodiment, the same effects as those of the first embodiment are obtained. Further, the resettable counter has a simpler circuit configuration than the random number generation part 7521 shown in FIG. 13. Accordingly, an advantage that the circuit configuration of the controller 7 may be simplified is obtained.

Third Embodiment

Next, a piezoelectric drive device according to the third embodiment will be explained.

Figure 18:
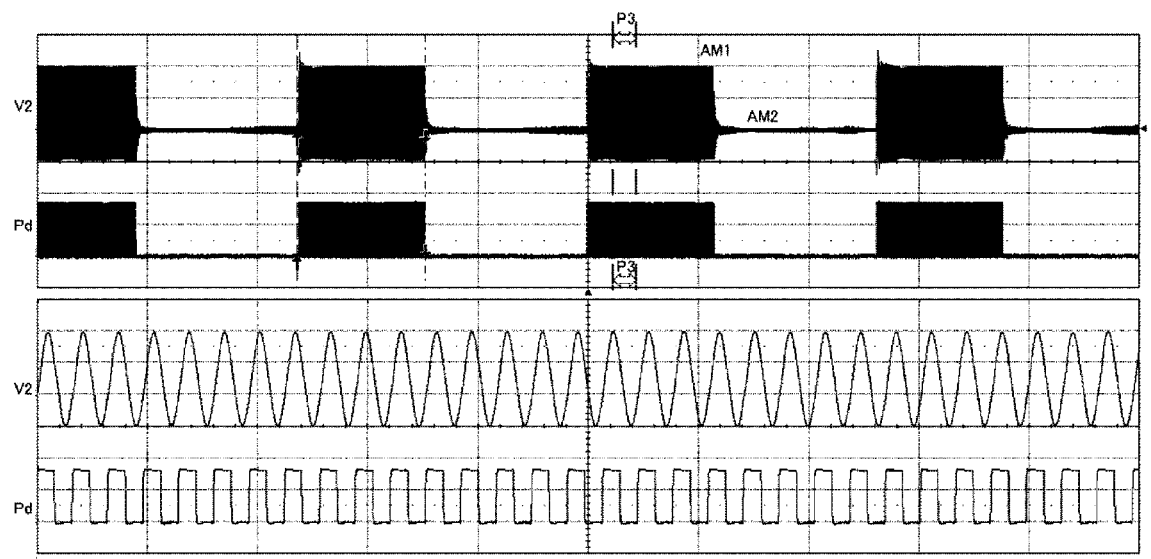
FIG. 18 shows examples of waveforms of alternating-current voltages V2 on which modulation signals based on intermittent waves are superimposed and examples of waveforms of PWM signals Pd generating the alternating-current voltages V2.

FIG. 18 shows the examples of waveforms of alternating-current voltages V2 on which modulation signals based on intermittent waves are superimposed and the examples of waveforms of PWM signals Pd generating the alternating-current voltages V2. Note that FIG. 18 shows the four waveforms in total, and the top waveform is the waveform of the alternating-current voltage V2 on which the modulation signals based on the intermittent waves are superimposed, and the third waveform from the top is the partially enlarged view of a P3 part of the top waveform. Further, the second top waveform is the waveform of the PWM signal Pd for generating the alternating-current voltage V2 on which the modulation signals based on the intermittent waves are superimposed, and the fourth waveform from the top is the partially enlarged view of a P3 part of the second top waveform.

As below, the third embodiment will be explained, and the explanation will be made with a focus on differences from the above described embodiments and the explanation of the same items will be omitted. In FIG. 18, the same configurations as those of the above described embodiment have the same signs.

The third embodiment is the same as the first embodiment except that the waveforms of the alternating-current voltages V2 are different. That is, the alternating-current voltage V2 shown in FIG. 18 as the drive signal generating the stretching vibration in the vibrating portion 41 has a waveform on which the modulation signals based on the intermittent waves are superimposed. The intermittent wave is also called burst wave and has a waveform in which a time with the amplitude fixed to a larger amplitude and a time with the amplitude fixed to a smaller amplitude are repeated. In the alternating-current voltage V2 shown in FIG. 18, the larger amplitude and the smaller amplitude are repeated in a fixed period. That is, also, in the alternating-current voltages V2 shown in FIG. 18, like the alternating-current voltages V2 shown in FIG. 15, the larger amplitudes AM1 and the smaller amplitudes AM2 are mixed.

The modulation signals generating the alternating-current voltage V2 shown in FIG. 18 may be easily generated using, e.g., an ON/OFF switch that alternately generates "0" and "1" or the like. That is, for generation of the alternating-current voltage V2 shown in FIG. 18, the ON/OFF switch may be mounted in place of the random number generation part 7521 shown in FIG. 13. The ON/OFF switch is provided, and thereby, modulation signals in which "0" and "1" alternately appear may be generated.

Note that a duty ratio in the intermittent wave, i.e., a ratio of the duration of the larger amplitude in the repetition period is not particularly limited, but preferably within a range from 5% to 80% and more preferably within a range from 10% to 60%. The duty ratio of the intermittent wave is set as described above, and thereby, stable driving and reduction of power consumption may be balanced.

Also, in the third embodiment, the same effects as those of the first embodiment are obtained. Further, the ON/OFF switch has a simpler circuit configuration than the random number generation part 7521 shown in FIG. 13 and the above described resettable counter. Accordingly, an advantage that the circuit configuration of the controller 7 may be simplified is obtained.

Fourth Embodiment

Figure 19:
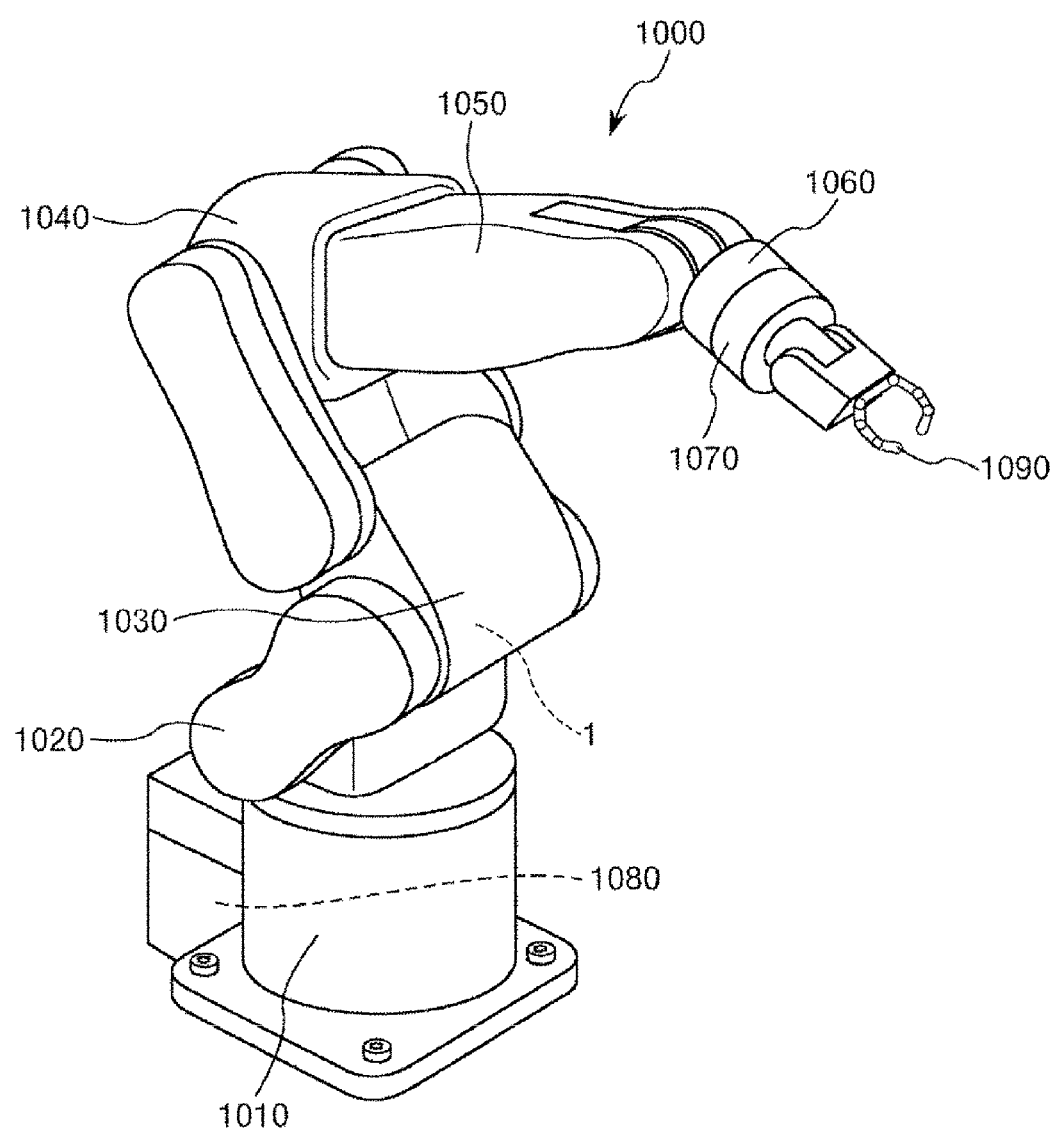
FIG. 19 is a perspective view showing a robot according to a fourth embodiment.

FIG. 19 is the perspective view showing the robot according to the fourth embodiment.

The robot 1000 shown in FIG. 19 may perform work of feeding, removing, carrying, assembly, etc. of precision apparatuses and components forming the apparatuses. The robot 1000 is a six-axis robot, and has a base 1010 fixed to a floor or ceiling, an arm 1020 pivotably coupled to the base 1010, an arm 1030 pivotably coupled to the arm 1020, an arm 1040 pivotably coupled to the arm 1030, an arm 1050 pivotably coupled to the arm 1040, an arm 1060 pivotably coupled to the arm 1050, an arm 1070 pivotably coupled to the arm 1060, and a control apparatus 1080 that controls driving of these arms 1020, 1030, 1040, 1050, 1060, 1070.

In the arm 1070, a hand coupling part is provided, and an end effector 1090 according to work to be executed by the robot 1000 is attached to the hand coupling part. The piezoelectric drive devices 1 are mounted on all or part of respective joint parts and the respective arms 1020, 1030, 1040, 1050, 1060, 1070 pivot by driving of the piezoelectric drive devices 1. Note that the piezoelectric drive device 1 may be mounted on the end effector 1090 and used for driving of the end effector 1090.

The control apparatus 1080 includes a computer having, e.g., a processor such as a CPU, memory, interface, etc. The processor executes predetermined programs stored in the memory, and thereby, controls driving of the individual parts of the robot 1000. Note that the programs may be downloaded from an external server via the interface. All or part of the configurations of the control apparatus 1080 may be provided outside of the robot 1000 and connected via a communication network such as a LAN (local area network).

As described above, the robot 1000 includes the piezoelectric drive devices 1.

That is, the robot 1000 includes the piezoelectric drive devices 1 each including the vibrator 4 (piezoelectric vibrator) having the vibrating portion 41 and the distal end portion 44 coupled to the vibrating portion 41, in which the distal end portion 44 makes elliptic motion by the stretching vibration and the flexural vibration of the vibrating portion 41, and the rotor 2 (driven member) driven by the elliptic motion of the distal end portion 44, wherein, when the rotor 2 (driven member) is stopped, the vibrator 4 performs the stretching vibration having the amplitude AM1 (first amplitude) and the amplitude AM2 (second amplitude) different from the amplitude AM1.

According to the piezoelectric drive device 1, even when the rotor 2 is stopped and disturbances exist, the rotation of the rotor 2 may be smoothly started with reduced power consumption. As a result, the robot 1000 that can stably drive with reduced power consumption is obtained.

Fifth Embodiment

Figure 20:
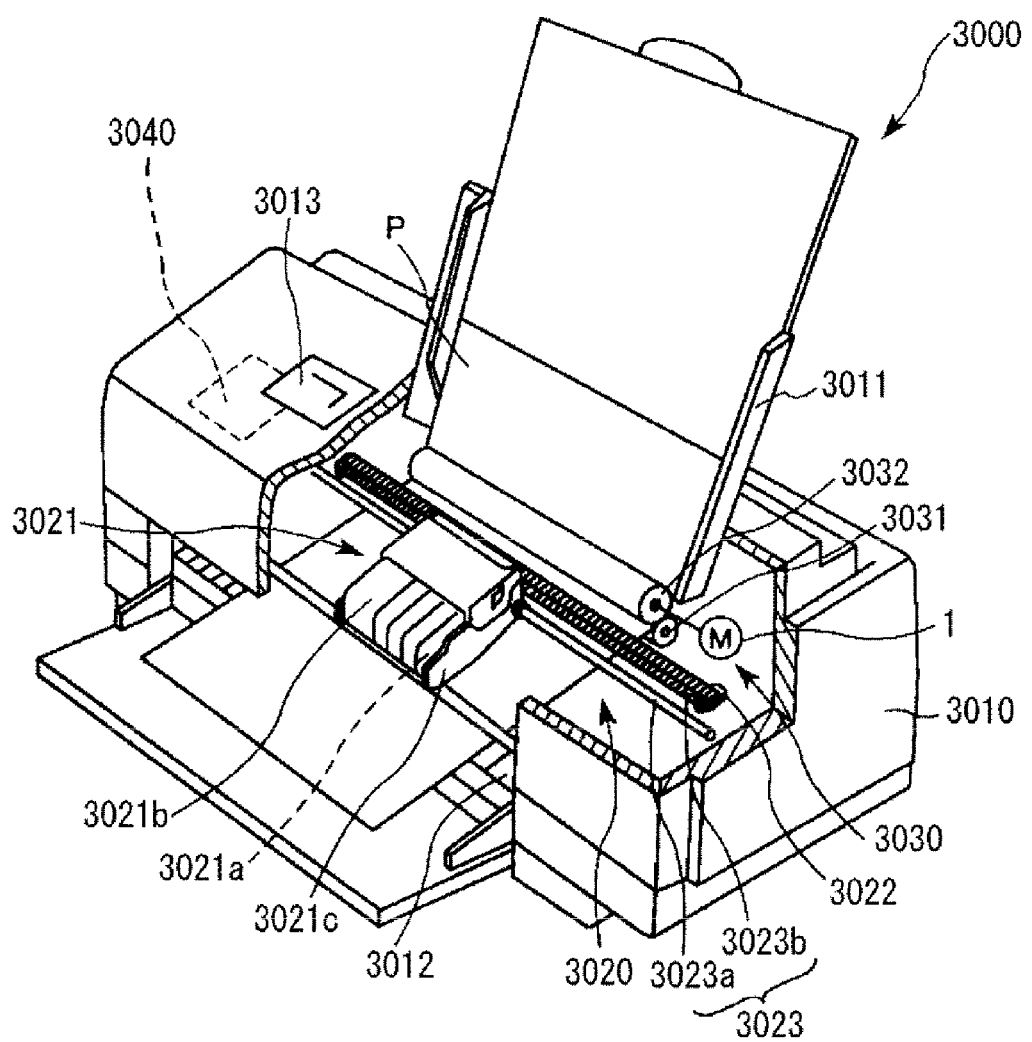
FIG. 20 is a schematic diagram showing an overall configuration of a printer according to a fifth embodiment.

FIG. 20 is the schematic diagram showing the overall configuration of the printer according to the fifth embodiment.

The printer 3000 shown in FIG. 20 includes an apparatus main body 3010, a printing mechanism 3020 provided inside of the apparatus main body 3010, a paper feed mechanism 3030, and a control apparatus 3040. In the apparatus main body 3010, a tray 3011 in which recording paper P is placed, a paper eject opening 3012 through which the recording paper P is ejected, and an operation panel 3013 of a liquid crystal display or the like are provided.

The printing mechanism 3020 includes a head unit 3021, a carriage motor 3022, and a reciprocation mechanism 3023 that reciprocates the head unit 3021 by drive power of the carriage motor 3022. The head unit 3021 has a head 3021a as an inkjet recording head, an ink cartridge 3021b that supplies ink to the head 3021a, and a carriage 3021c on which the head 3021a and the ink cartridge 3021b are mounted.

The reciprocation mechanism 3023 has a carriage guide shaft 3023a that reciprocably supports the carriage 3021c and a timing belt 3023b that moves the carriage 3021c on the carriage guide shaft 3023a by the drive power of the carriage motor 3022. The paper feed mechanism 3030 has a driven roller 3031 and a driving roller 3032 in press contact with each other, and the piezoelectric drive device 1 that drives the driving roller 3032.

In the printer 3000, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

The control apparatus 3040 includes a computer having, e.g., a processor such as a CPU, memory, interface, etc. The processor executes predetermined programs stored in the memory, and thereby, controls driving of the respective parts of the printer 3000. For example, the control is executed based on print data externally input via the interface. Note that the programs may be downloaded from an external server via the interface. All or part of the configurations of the control apparatus 3040 may be provided outside of the printer 3000 and connected via a communication network such as a LAN (local area network).

As described above, the printer 3000 has the piezoelectric drive device 1.

That is, the printer 3000 includes the piezoelectric drive device 1 including the vibrator 4 (piezoelectric vibrator) having the vibrating portion 41 and the distal end portion 44 coupled to the vibrating portion 41, in which the distal end portion 44 makes elliptic motion by the stretching vibration and the flexural vibration of the vibrating portion 41, and the rotor 2 (driven member) driven by the elliptic motion of the distal end portion 44, wherein, when the rotor 2 (driven member) is stopped, the vibrator 4 performs the stretching vibration having the amplitude AM1 (first amplitude) and the amplitude AM2 (second amplitude) different from the amplitude AM1.

According to the piezoelectric drive device 1, even when the rotor 2 is stopped, the rotation of the rotor 2 may be smoothly started with reduced power consumption. As a result, the printer 3000 that can stably drive with reduced power consumption is obtained.

Note that, in the embodiment, the piezoelectric drive device 1 drives the driving roller 3032 for paper feed, however, may also drive, e.g., the carriage 3021c.

As above, the control method for the piezoelectric drive device, piezoelectric drive device, robot, and printer according to the present disclosure are explained according to the illustrated embodiments, however, the present disclosure is not limited to those. The configurations of the respective parts may be replaced by arbitrary configurations having the same functions. Further, other arbitrary configurations may be added to the present disclosure. Furthermore, the respective embodiments may be combined as appropriate.

What is claimed is:

1. A control method for a piezoelectric drive device including:
   a piezoelectric vibrator having a vibrating portion and a distal end portion coupled to the vibrating portion, in which the distal end portion makes elliptic motion by a stretching vibration and a flexural vibration of the vibrating portion;
   a driven member driven by the elliptic motion of the distal end portion; and
   a drive signal generation circuit outputting a stretching vibration drive signal that generates the stretching vibration and a flexural vibration drive signal that generates the flexural vibration in the piezoelectric vibrator,
   the control method comprising, when the driven member is stopped, superimposing and outputting a modulation signal for amplitude modification on the stretching vibration drive signal by the drive signal generation circuit.

2. The control method for the piezoelectric drive device according to claim 1, wherein
the vibrating portion includes a driving piezoelectric element having a piezoelectric material and an electrode provided on the piezoelectric material, and
the stretching vibration and the flexural vibration are vibrations in a planar surface parallel to a surface of the electrode.

3. The control method for the piezoelectric drive device according to claim 1, wherein
the stretching vibration drive signal is formed by superimposition of a modulation signal based on a random number.

4. The control method for the piezoelectric drive device according to claim 1, wherein
the stretching vibration drive signal is formed by superimposition of a modulation signal based on a ramp wave.

5. The control method for the piezoelectric drive device according to claim 1, wherein
the stretching vibration drive signal is formed by superimposition of a modulation signal based on an intermittent wave.

6. The control method for the piezoelectric drive device according to claim 3, wherein the modulation signal for amplitude modulation is changed with time.

7. A piezoelectric drive device comprising:
a piezoelectric vibrator having a vibrating portion and a distal end portion coupled to the vibrating portion, in which the distal end portion makes elliptic motion by a stretching vibration and a flexural vibration of the vibrating portion; and
a driven member driven by the elliptic motion of the distal end portion, wherein
when the driven member is stopped, the piezoelectric vibrator performs the stretching vibration containing a first amplitude and a second amplitude different from the first amplitude.

8. A piezoelectric drive device comprising:
a piezoelectric vibrator having a vibrating portion and a distal end portion coupled to the vibrating portion, in which the distal end portion makes elliptic motion by a stretching vibration and a flexural vibration of the vibrating portion;
a driven member driven by the elliptic motion of the distal end portion; and
a drive signal generation circuit outputting a stretching vibration drive signal that generates the stretching vibration and a flexural vibration drive signal that generates the flexural vibration in the piezoelectric vibrator, wherein
when the driven member is stopped, the drive signal generation circuit superimposes and outputs a modulation signal for amplitude modification on the stretching vibration drive signal.

9. A robot comprising a piezoelectric drive device,
the piezoelectric drive device including:
a piezoelectric vibrator having a vibrating portion and a distal end portion coupled to the vibrating portion, in which the distal end portion makes elliptic motion by a stretching vibration and a flexural vibration of the vibrating portion; and
a driven member driven by the elliptic motion of the distal end portion, wherein
when the driven member is stopped, the piezoelectric vibrator performs the stretching vibration containing a first amplitude and a second amplitude different from the first amplitude.

10. A printer comprising a piezoelectric drive device,
the piezoelectric drive device including:
a piezoelectric vibrator having a vibrating a portion and a distal end portion coupled to the vibrating portion, in which the distal end portion makes elliptic motion by a stretching vibration and a flexural vibration of the vibrating portion; and
a driven member driven by the elliptic motion of the distal end portion, wherein
when the driven member is stopped, the piezoelectric vibrator performs the stretching vibration containing a first amplitude and a second amplitude different from the first amplitude.

* * * * *